United States Patent
Maehara et al.

(10) Patent No.: US 6,603,128 B2
(45) Date of Patent: Aug. 5, 2003

(54) CHARGED-PARTICLE BEAM EXPOSURE APPARATUS AND DEVICE MANUFACTURING METHOD

(75) Inventors: Hiroshi Maehara, Kanagawa (JP); Haruhito Ono, Kanagawa (JP); Yasuhiro Shimada, Kanagawa (JP); Takayuki Yagi, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 221 days.

(21) Appl. No.: 09/842,120

(22) Filed: Apr. 26, 2001

(65) Prior Publication Data
US 2002/0009901 A1 Jan. 24, 2002

(30) Foreign Application Priority Data
Apr. 27, 2000 (JP) .......................................... 2000-128513
Apr. 23, 2001 (JP) .......................................... 2001-124727

(51) Int. Cl.⁷ ............................................... H01J 37/00
(52) U.S. Cl. .................................. 250/441.11; 250/492.2
(58) Field of Search ........................... 250/441.11, 492.2

(56) References Cited
U.S. PATENT DOCUMENTS
4,607,167 A * 8/1986 Petric ...................... 250/492.2

* cited by examiner

Primary Examiner—Kiet T. Nguyen
(74) Attorney, Agent, or Firm—Fitzpatrick, Cella, Harper & Scinto

(57) ABSTRACT

A correction electron optical system (3) has substrates in which apertures for constituting electron lenses are formed. Valves (14) whose opening degrees can be adjusted are used to relax the pressure difference between the upper and lower surfaces of each substrate caused when supply/exhaust pumps (51–56) adjust the internal pressure of a main body cover (80). The opening degrees are controlled based on outputs from differential pressure sensors (13). The pressure sensors (13) can be replaced with photosensors.

22 Claims, 19 Drawing Sheets

FIG. 19

```
URL  http://www.maintain.co.jp/db/input.html

TROUBLE DB INPUT WINDOW

OCCURRENCE DATE   2000/3/15  ~4040
TYPE OF APPARATUS  **********  ~4010
SUBJECT           OPERATION ERROR (START-UP ERROR)  ~4030
SERIAL NUMBER S/N  465NS4580001  ~4020
DEGREE OF URGENCY  D  ~4050
SYMPTOM   LED KEEPS FLICKERING AFTER
          POWER-ON                         ~4060

REMEDY    POWER ON AGAIN
          (PRESS RED BUTTON IN ACTIVATION) ~4070

PROGRESS  INTERIM HAS BEEN DONE            ~4080

(SEND)(RESET)    4100              4110           4120
              LINK TO RESULT LIST DATABASE  SOFTWARE LIBRARY  OPERATING GUIDE
```

CHARGED-PARTICLE BEAM EXPOSURE APPARATUS AND DEVICE MANUFACTURING METHOD

FIELD OF THE INVENTION

The present invention relates to a charged-particle beam exposure apparatus and device manufacturing method suitable for manufacturing devices such as a semiconductor device, micromachine, micro electron optical element, micro optical element, Fresnel lens, and binary optics.

BACKGROUND OF THE INVENTION

Charged-particle beam exposure apparatuses such as an electron beam exposure apparatus and ion beam exposure apparatus exploit electron lenses. There is known a technique of forming an electron lens on a thin substrate (membrane) in order to downsize an electron optical system.

During exposure with a charged-particle beam, the interior of a charged-particle beam exposure apparatus, particularly the environment of an electron optical system which transmits a charged-particle beam keeps a high vacuum state in order to prevent attenuation of the charged-particle beam. To the contrary, when the apparatus does not operate or is to be maintained, the high vacuum state is canceled, and the interior is exposed to the atmospheric pressure. In adjusting the internal pressure of the charged-particle beam exposure apparatus, the pressure difference between the upper and lower surfaces of a substrate having an electron lens may change to deform the substrate. This deformation degrades the optical performance of the electron lens, and may damage the substrate in the worst case. The rigidity of the substrate decreases as the substrate becomes thinner for downsizing, so problem becomes more serious.

To prevent this problem, an abrupt pressure change is avoided by gently adjusting the pressure (supplying/exhausting air) for a long time. However, the long adjustment time decreases the effective availability (throughput) of the apparatus.

SUMMARY OF THE INVENTION

The present invention has been made in consideration of the above situation, and has as its object to prevent deformation of or damage to a substrate included in an electron optical system without degrading the performance or device manufacturing efficiency of a charged-particle beam exposure apparatus.

A charged-particle beam exposure apparatus according to the first aspect of the present invention comprises a charged-particle beam source, an electron optical system which irradiates a device material with the charged-particle beam emitted by the charged-particle beam source and includes a substrate having an aperture for transmitting the charged-particle beam, a cover which covers the charged-particle beam source and the electron optical system, an adjustment mechanism for adjusting a pressure in an internal space of the cover, and a relaxing mechanism for relaxing a pressure difference between upper and lower surfaces of the substrate upon a change in pressure in the internal space.

In the charged-particle beam exposure apparatus according to the first aspect of the present invention, the relaxing mechanism preferably has, e.g., a passage which allows a space facing the substrate to communicate with the internal space.

In the charged-particle beam exposure apparatus according to the first aspect of the present invention, the relaxing mechanism preferably has a valve at an end of the passage or midway along the passage.

In the charged-particle beam exposure apparatus according to the first aspect of the present invention, it is preferable that the apparatus further comprise a sensor for measuring information about the substrate, and that the controller control at least one of an opening degree of the valve and the adjustment mechanism on the basis of an output from the sensor. In this case, the sensor is preferably a pressure sensor for detecting the pressure difference between the upper and lower surfaces of the substrate, or a photosensor for optically detecting deformation of the substrate.

In the charged-particle beam exposure apparatus according to the first aspect of the present invention, it is preferable that the electron optical system have a plurality of substrates in which apertures for transmitting the charged-particle beam emitted by the charged-particle beam source are formed, and that the relaxing mechanism relax a pressure difference between upper and lower surfaces of each substrate.

In the charged-particle beam exposure apparatus according to the first aspect of the present invention, the relaxing mechanism preferably relaxes the pressure difference so as to prevent the pressure difference between the upper and lower surfaces of the substrate from exceeding a predetermined range.

In the charged-particle beam exposure apparatus according to the first aspect of the present invention, the controller preferably automatically executes control when the charged-particle beam exposure apparatus is turned on or off or maintained, or an emergency occurs.

In the charged-particle beam exposure apparatus according to the first aspect of the present invention, the substrate preferably has an electrode for applying a potential to the aperture of the substrate.

In the charged-particle beam exposure apparatus according to the first aspect of the present invention, the electron optical system preferably includes a plurality of substrates which have apertures for transmitting the charged-particle beam emitted by the charged-particle beam source and are arranged along a path of the charged-particle beam, and spacers disposed at all or some of intervals between the plurality of substrates. In this case, the spacers preferably have apertures at positions corresponding to the apertures formed in the plurality of substrates.

In the charged-particle beam exposure apparatus according to the first aspect of the present invention, it is preferable that the electron optical system include a plurality of substrates which have apertures for transmitting the charged-particle beam emitted by the charged-particle beam source and are arranged along a path of the charged-particle beam, and that all or some of the plurality of substrates be arranged to form a nested structure.

In the charged-particle beam exposure apparatus according to the first aspect of the present invention, it is preferable that the plurality of substrates respectively have membranes in which apertures are formed, and annular supports which support the membranes, that the electron optical system further include a base substrate which commonly supports the supports of the substrates which form the nested structure, and that the base substrate have an aperture which allows a space defined by the nested structure to communicate with the internal space of the cover.

A device manufacturing method according to the second aspect of the present invention comprises the steps of drawing a pattern on a device material by irradiating the device material with a charged-particle beam emitted by a charged-particle beam source via an electron optical system including a substrate having an aperture for transmitting the charged-particle beam, and relaxing a change in pressure difference between upper and lower surfaces of the substrate.

In the second aspect of the present invention, the step of relaxing the change in pressure difference preferably includes at least one of the step of adjusting a pressure in an internal space of a cover which covers the charged-particle beam source and the electron optical system, and the step of controlling a valve interposed between a space facing the substrate and the internal space of the cover which covers the charged-particle beam source and the electron optical system.

In the second aspect of the present invention, the device manufacturing method preferably further comprises the steps of applying a photosensitive agent to the device material, and developing the device material on which the pattern is drawn.

A device manufacturing method according to the third aspect of the present invention comprises the steps of installing a plurality of semiconductor manufacturing apparatuses including a charged-particle beam exposure apparatus in a factory, and manufacturing a semiconductor device by using the plurality of semiconductor manufacturing apparatuses, wherein the charged-particle beam exposure apparatus has a charged-particle beam source, an electron optical system which irradiates a device material with the charged-particle beam emitted by the charged-particle beam source and includes a substrate having an aperture for transmitting the charged-particle beam, a cover which covers the charged-particle beam source and the electron optical system, an adjustment mechanism for adjusting a pressure in an internal space of the cover, and a relaxing mechanism for relaxing a pressure difference between upper and lower surfaces of the substrate upon a change in pressure in the internal space.

The device manufacturing method according to the third aspect of the present invention preferably further comprises the steps of connecting the plurality of semiconductor manufacturing apparatuses via a local area network, connecting the local area network to an external network of the factory, acquiring information about the charged-particle beam exposure apparatus from a database on the external network by using the local area network and the external network, and controlling the charged-particle beam exposure apparatus on the basis of the acquired information.

A semiconductor manufacturing factory according to the fourth aspect of the present invention comprises a plurality of semiconductor manufacturing apparatuses including a charged-particle beam exposure apparatus, a local area network for connecting the plurality of semiconductor manufacturing apparatuses, and a gateway for connecting the local area network to an external network of the semiconductor manufacturing factory, wherein the charged-particle beam exposure apparatus has a charged-particle beam source, an electron optical system which irradiates a device material with the charged-particle beam emitted by the charged-particle beam source and includes a substrate having an aperture for transmitting the charged-particle beam, a cover which covers the charged-particle beam source and the electron optical system, an adjustment mechanism for adjusting a pressure in an internal space of the cover, and a relaxing-mechanism for relaxing a pressure difference between upper and lower surfaces of the substrate upon a change in pressure in the internal space.

A maintenance method for a charged-particle beam exposure apparatus according to the fifth aspect of the present invention comprises the steps of preparing a database for accumulating information about maintenance of the charged-particle beam exposure apparatus on an external network of a factory where the charged-particle beam exposure apparatus is installed, connecting the charged-particle beam exposure apparatus to a local area network in the factory, and maintaining the charged-particle beam exposure apparatus on the basis of the information accumulated in the database by using the external network and the local area network, wherein the charged-particle beam exposure apparatus has a charged-particle beam source, an electron optical system which irradiates a device material with the charged-particle beam emitted by the charged-particle beam source and includes a substrate having an aperture for transmitting the charged-particle beam, a cover which covers the charged-particle beam source and the electron optical system, an adjustment mechanism for adjusting a pressure in an internal space of the cover, and a relaxing mechanism for relaxing a pressure difference between upper and lower surfaces of the substrate upon a change in pressure in the internal space.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 19 is a view showing a user interface on a display.

DETAILED DESCRIPTION OF THE PREFERRED EMBODIMENTS

Preferred embodiments of the present invention will be described in detail in accordance with the accompanying drawings. Note that an electron beam exposure apparatus will be described as an example of a charged-particle beam exposure apparatus, but the present invention can also be applied to another charged-particle beam exposure apparatus such as an ion beam exposure apparatus.

Figure 1:
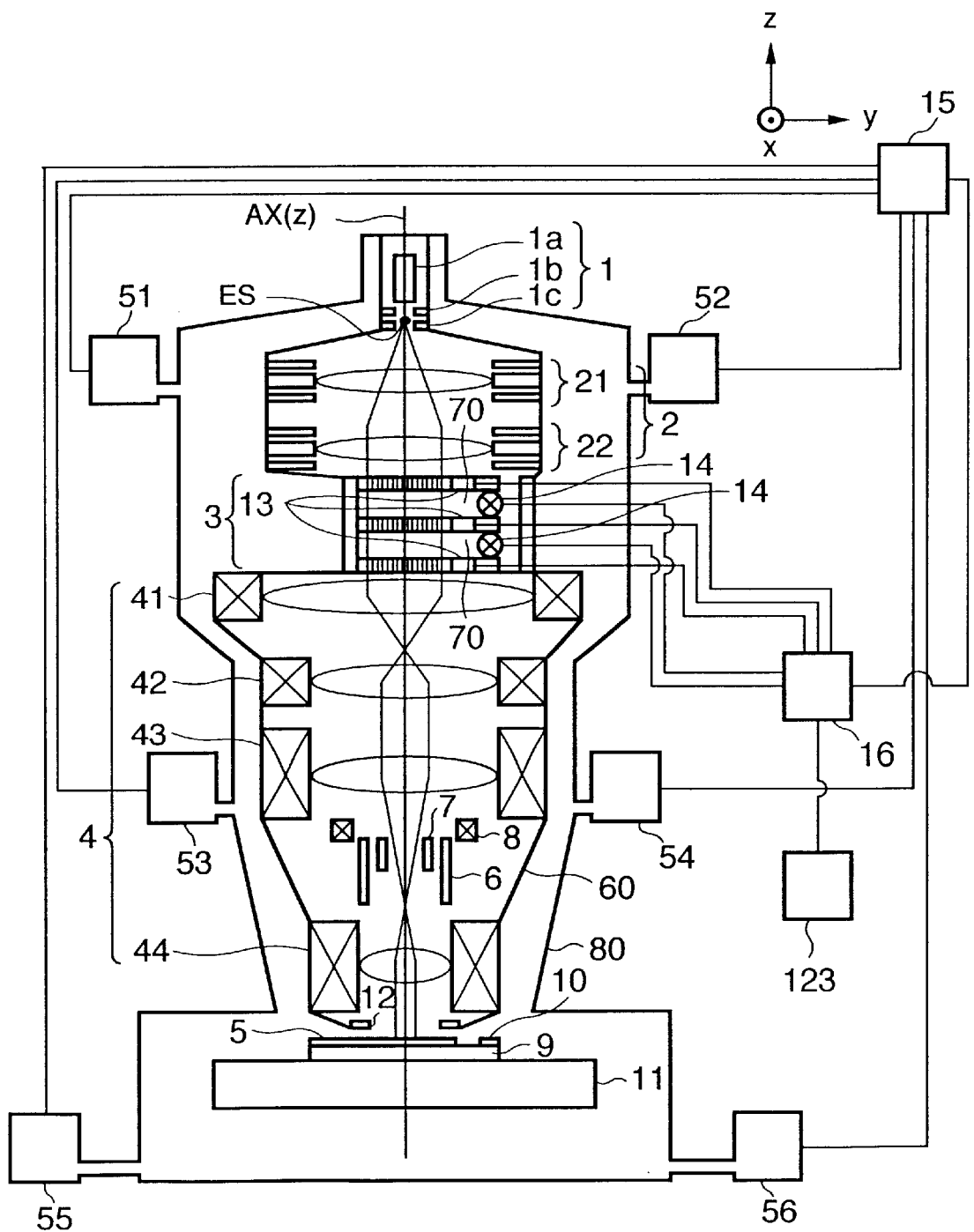
FIG. 1 is a view showing the schematic arrangement of an electron beam exposure apparatus according to a preferred embodiment of the present invention.

FIG. 1 is a view showing the schematic arrangement of an electron beam exposure apparatus according to a preferred embodiment of the present invention. In FIG. 1, reference numeral 1 denotes an electron gun including a cathode 1a, grid 1b, and anode 1c. Electrons emitted by the cathode 1a form a crossover image between the grid 1b and the anode 1c. This crossover image will be referred to as an electron source ES.

Electrons emitted by the electron source ES are collimated by a condenser lens 2 and irradiates a correction electron optical system 3. The a condenser lens 2 is constituted by a plurality of aperture electrodes.

The correction electron optical system 3 comprises an aperture array AA, blanker array BA, element electron optical system array unit LAU, and stopper array SA sequentially arranged along an optical axis AX from the electron gun 1. For illustrative convenience, FIG. 1 shows only three substrates (membranes or thin plate-like members) as building elements of the correction electron optical system 3. Details of the correction electron optical system 3 will be described later.

The correction electron optical system 3 forms a plurality of intermediate images of the electron source ES. Each intermediate image is reduced and projected on a wafer (device material) 5 by a reduction electron optical system 4. The correction electron optical system 3 forms a plurality of intermediate images at positions where aberration of the reduction electron optical system 4 is corrected.

The reduction electron optical system 4 is constituted by a symmetrical magnetic doublet made up of a first projection lens 41 (43) and second projection lens 42 (44). Letting f1 be the focal length of the first projection lens 41 (43), and f2 be the focal length of the second projection lens 42 (44), the distance between the two lenses is f1+f2. The object point on the optical axis AX is at the focal position of the first projection lens 41 (43), and the image point is at the focal point of the second projection lens 42 (44). An intermediate image is reduced to –f2/f1. Since the magnetic fields of the two lenses are determined to act in opposite directions, Seidel aberrations and chromatic aberrations concerning rotation and magnification are theoretically canceled except for five aberrations, i.e., spherical aberration, isotropic astigmatism, isotropic coma, curvature of field, and on-axis chromatic aberration.

Reference numeral 6 denotes a deflector for deflecting a plurality of electron beams from the correction electron optical system 3 and displacing the projection images of a plurality of intermediate images on the wafer 5 by the same displacement amount in the X and Y directions. The deflector 6 includes a main deflector used when the deflection width is large, and a sub-deflector used when the deflection width is small. The main deflector is an electromagnetic deflector, whereas the sub-deflector is an electrostatic deflector.

Reference numeral 7 denotes a dynamic focus coil for correcting a shift in the focal position of a projection image caused by a deflection error generated when the deflector 6 operates; and 8, a dynamic stigmatic coil for correcting astigmatism among deflection errors generated by deflection.

Reference numeral 9 denotes a θ-Z stage which supports the wafer 5 and is movable in the optical axis AX (Z-axis) direction and the rotational direction around the Z-axis; and 10, a stage reference plate fixed to the θ-Z stage 9.

Reference numeral 11 denotes an X-Y stage which supports the θ-Z stage and is movable in the X and Y directions perpendicular to the optical axis AX (Z-axis).

Reference numeral 12 denotes a reflected-electron detector for detecting reflected electrons generated upon irradiating a mark on the stage reference plate 10 with an electron beam.

Reference numerals 13 denote differential pressure sensors attached to a plurality of substrates (aperture array AA, blanker array BA, element electron optical system array unit LAU, and stopper array SA) constituting the correction electron optical system 3. Each differential pressure sensor 13 includes a pressure sensor for measuring the pressure difference between the upper and lower surfaces of a substrate equipped with this differential pressure sensor. A plurality of substrates constituting the correction electron optical system 3 are arranged at intervals. Spaces 70 forming the intervals communicate with the internal space of a lens barrel cover 60 (further, that of a main body cover 80) via passages having proper sectional areas. The sectional area of each passage is preferably larger than the total area of a plurality of apertures formed in each substrate. This can prevent damage to the substrate caused by the pressure difference between two sides or a decrease in precision caused by deformation when the pressure is decreased/increased in the internal space of the main body cover 80. The spaces 70 preferably communicate with spaces above and below the correction electron optical system 3 via the passages or other passages.

Reference numerals 51 to 56 denote supply/exhaust pumps which exhaust gas (e.g., air) in the main body cover 80 to evacuate the internal space of the main body cover 80 to a predetermined vacuum degree, or supply gas (e.g., air) into the main body cover 80 to set the internal space of the main body cover 80 to the atmospheric pressure; and 15, a pump controller for controlling the supply/exhaust pumps 51 to 56. As the pressure in the main body cover 80 is decreased/increased by the supply/exhaust pumps 51 to 56, the pressures in the spaces 70 between the substrates constituting the correction electron optical system 3 are also decreased/increased.

Valves 14 capable of adjusting the opening degree may be arranged at the ends of the passages or midway along the passages which allow the spaces 70 to communicate with the internal space of the lens barrel cover 60 (further, that of the main body cover 80). The opening degrees (or supply/ exhaust rates or flow rates) of the valves 14 can be controlled by a supply/exhaust controller 16 on the basis of outputs from the pressure sensors 13 so as to make the pressure difference between the two sides of each substrate constituting the correction electron optical system 3 fall within a predetermined range (allowable range).

The supply/exhaust controller 16 also controls the supply/exhaust pumps 51 to 56 on the basis of outputs from the pressure sensors 13 so as to make the pressure difference between the two sides of each substrate constituting the correction electron optical system 3 fall within a predetermined range (allowable range). The supply/exhaust controller 16 operates in accordance with instructions from a main controller 123.

Figure 2:
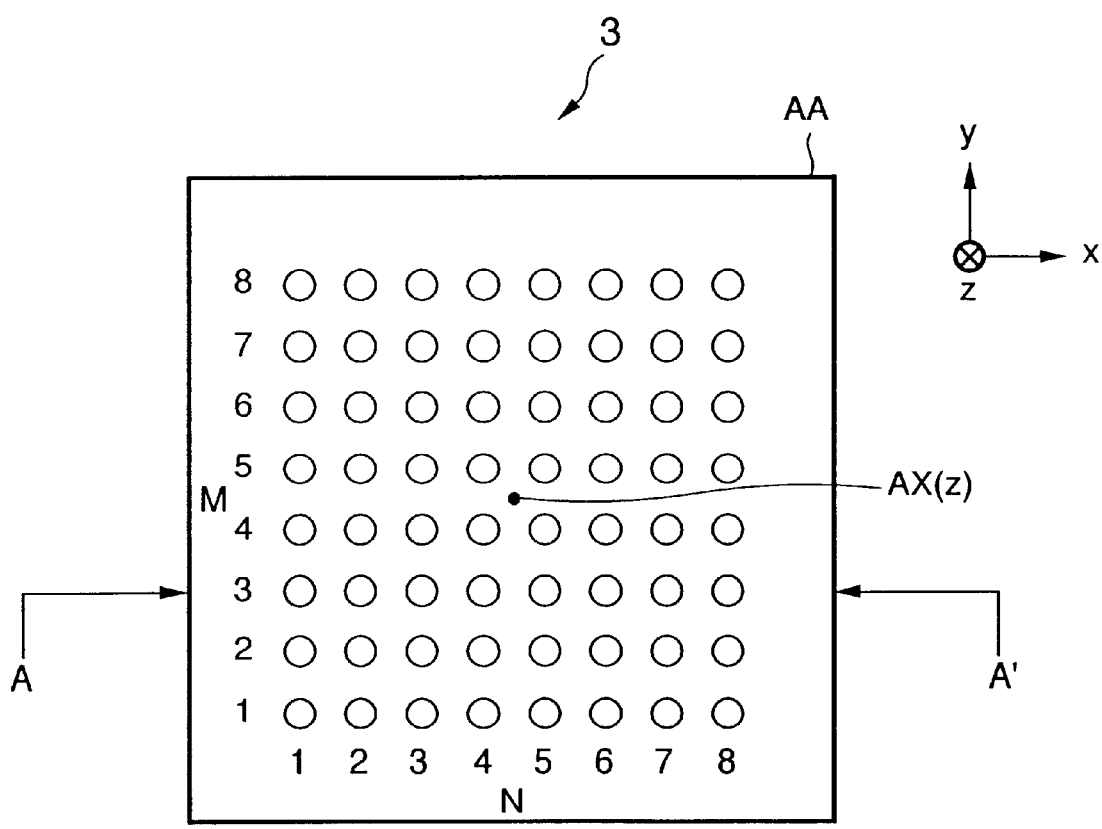
FIG. 2 is a view of a correction electron optical system when viewed from an electron gun.
Figure 3:
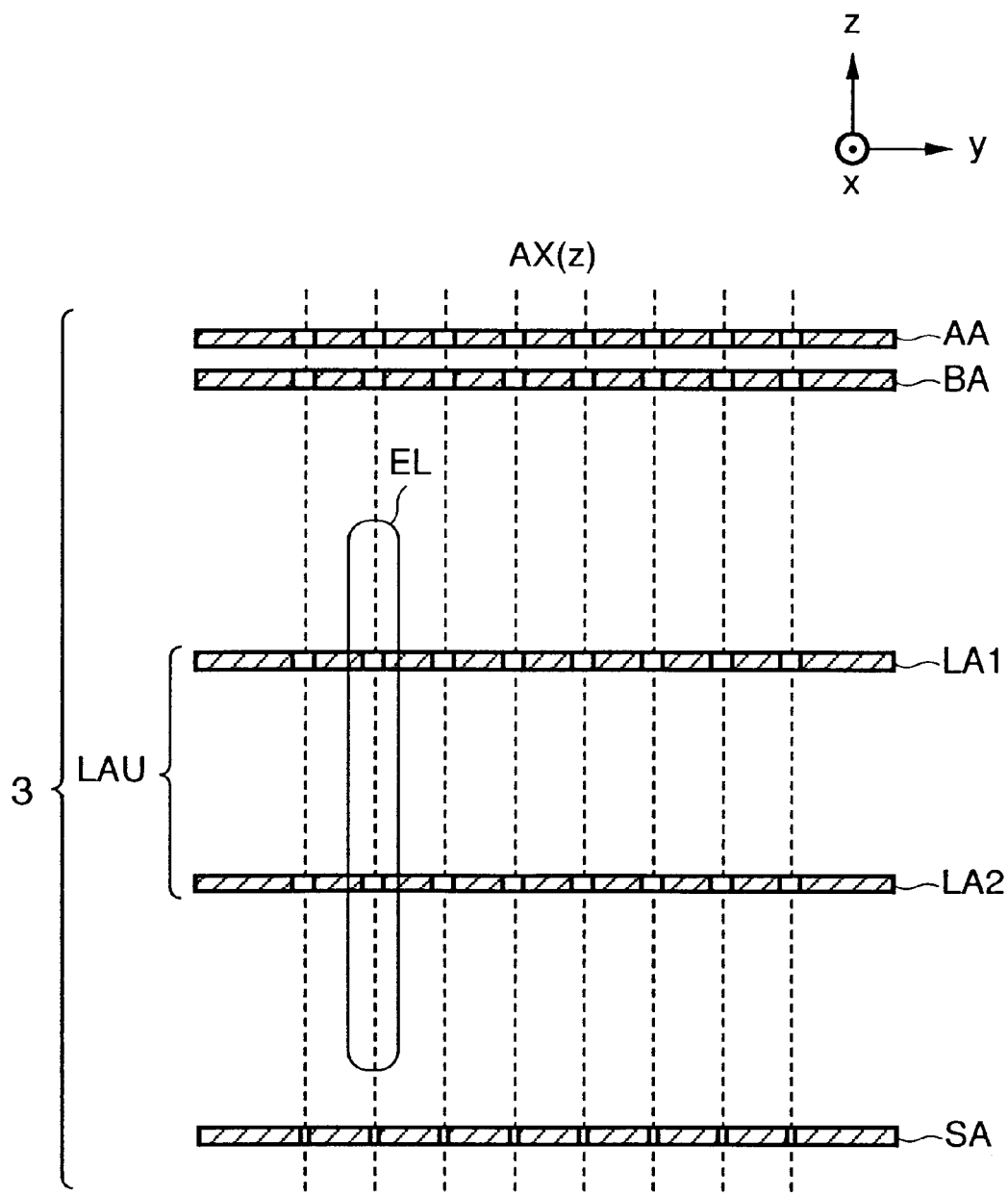
FIG. 3 is a sectional view of the correction electron optical system taken along the line A–A' in FIG. 2.

FIG. 2 is a view of the correction electron optical system 3 when viewed from the electron gun 1, and FIG. 3 is a sectional view of the correction electron optical system 3 taken along the line A–A' in FIG. 2. As described above, the correction electron optical system 3 is preferably comprised of the aperture array AA, blanker array BA, element electron optical system array unit LAU, and stopper array SA.

As shown in FIG. 2, the aperture array AA is a substrate having a plurality of apertures, and splits one electron beam from the condenser lens 2 into a plurality of electron beams.

Figure 4:
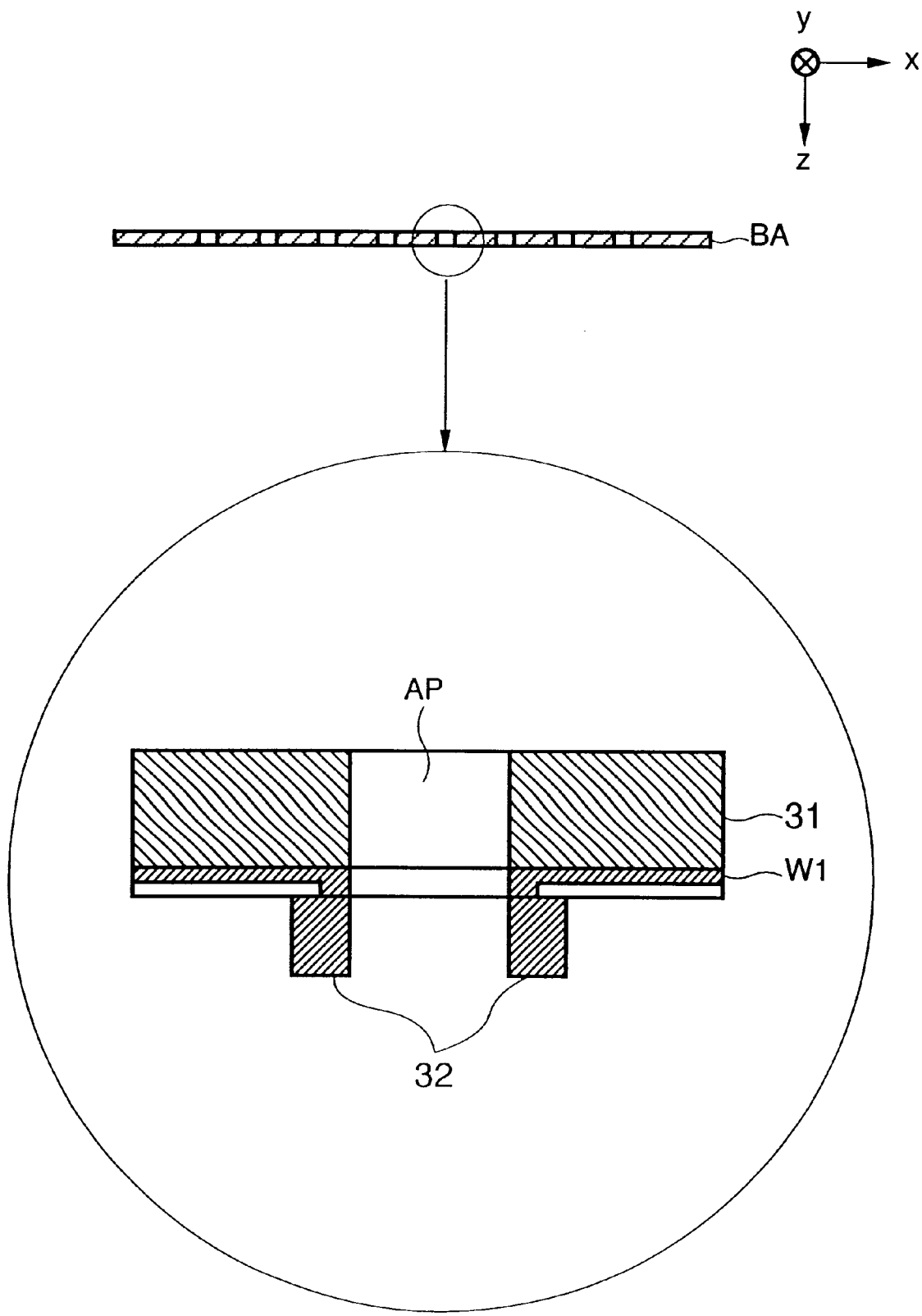
FIG. 4 is a view schematically showing one of a plurality of deflectors (blankers) formed on a blanker array.

The blanker array BA is a substrate having a plurality of deflectors (blankers) for individually controlling whether to deflect electron beams split by the aperture array AA. FIG. 4 is a view schematically showing one of a plurality of deflectors (blankers) formed on the blanker array BA. In FIG. 4, a substrate 31 has an aperture AP, and a pair of electrodes (deflectors) 32 which sandwich the aperture AP. Further, the substrate 31 has a wiring line W1 for individually turning on/off the deflectors 32.

The element electron optical system array unit LAU is formed from first and second electron optical system arrays LA1 and LA2 prepared by two-dimensionally arraying a plurality of electron lenses on the same plane.

Figure 5:
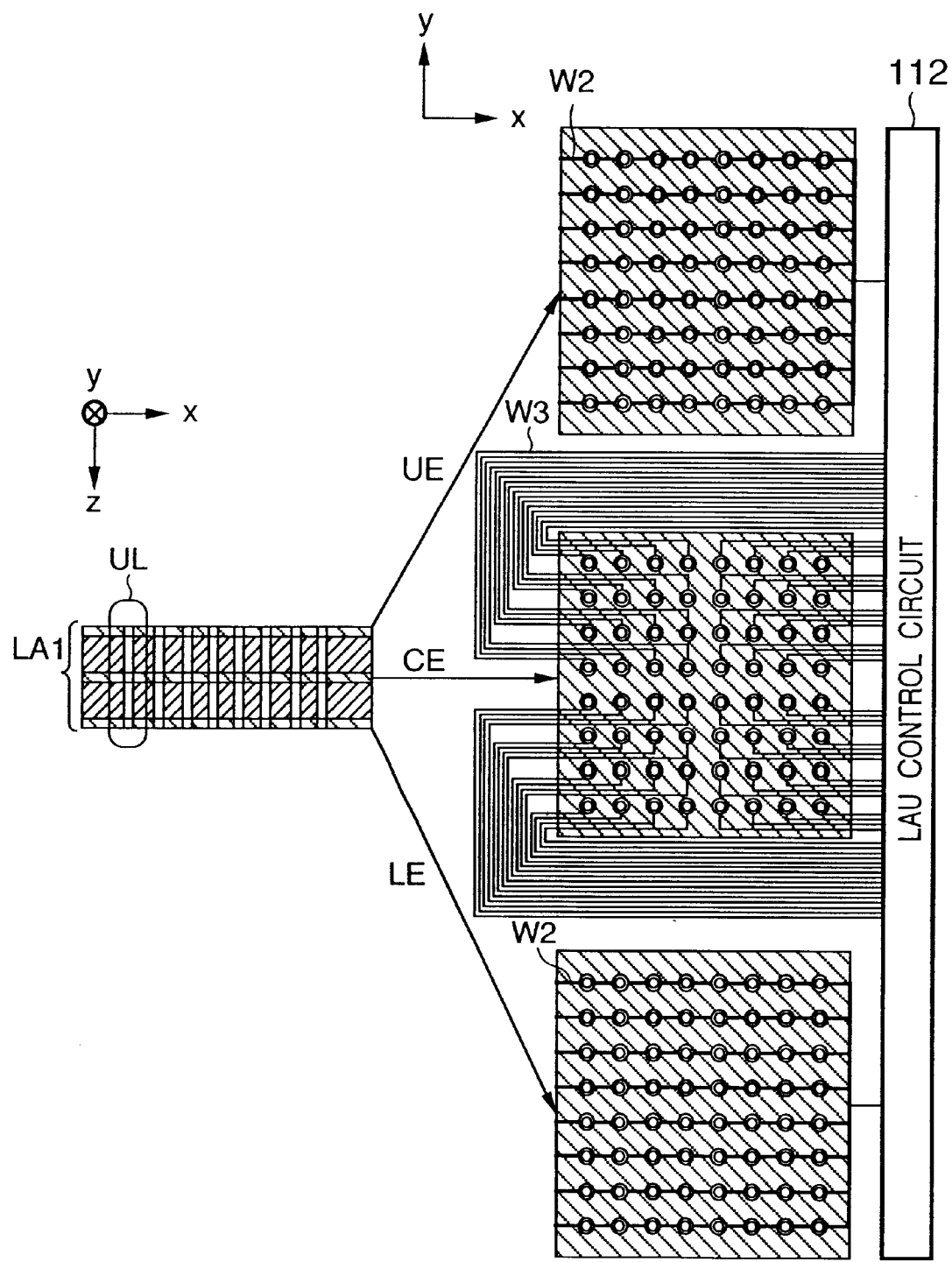
FIG. 5 is a view showing the structure of first and second electron optical system arrays.

FIG. 5 is a view showing the structure of the first electron optical system array LA1. The first electron optical system array LA1 has three, upper, middle, and lower electrode plates UE, CE, and LE each having an array of doughnut-like electrodes corresponding to a plurality of apertures. The three electrode plates are stacked via, e.g., insulators. Doughnut-like electrodes of the upper, middle, and lower electrode plates function as one electron lens (so-called unipotential lens) UL. All the doughnut-like electrodes of the upper and lower electrode plates of the respective electron lenses UL are connected to an LAU control circuit 112 via common wiring lines W2 and receive the same potential. In this embodiment, the potentials of the doughnut-like electrodes of the upper and lower electrode plates act as electron beam acceleration potentials. The doughnut-like electrodes of the middle electrode plate of the respective electron lenses UL are connected to the LAU control circuit 112 via individual wiring lines W3 and receive independent potentials. This enables setting the electron optical powers (focal lengths) of the electron lenses UL to desired values. The second electron optical system array LA2 also has the same structure and function as those of the first electron optical system array LA1.

As shown in FIG. 3, in the element electron optical system array unit LAU, one electron lens of the first electron lens array LA1 and one electron lens of the second electron lens array LA2 form one element electron optical system EL. The aperture array AA is positioned on almost the front focal position of the respective element electron optical systems EL. The element electron optical systems EL, therefore, form intermediate images of the electron source ES at almost the rear focal positions by a plurality of split electron beams. The formation positions of the intermediate images are individually adjusted by adjusting the electron optical powers of the electron lenses for the respective element electron optical systems EL so as to correct the influence of the curvature of field of the reduction electron optical system 4 which appears when the intermediate images are reduced and projected on the wafer 5 via the reduction electron optical system 4.

Similar to the aperture array AA, the stopper array SA is a substrate having a plurality of apertures. The orbit of an electron beam deflected by the blanker array BA is so changed as to be incident outside an aperture of the stopper array SA corresponding to the electron beam, and does not pass the stopper array SA.

Figure 6:
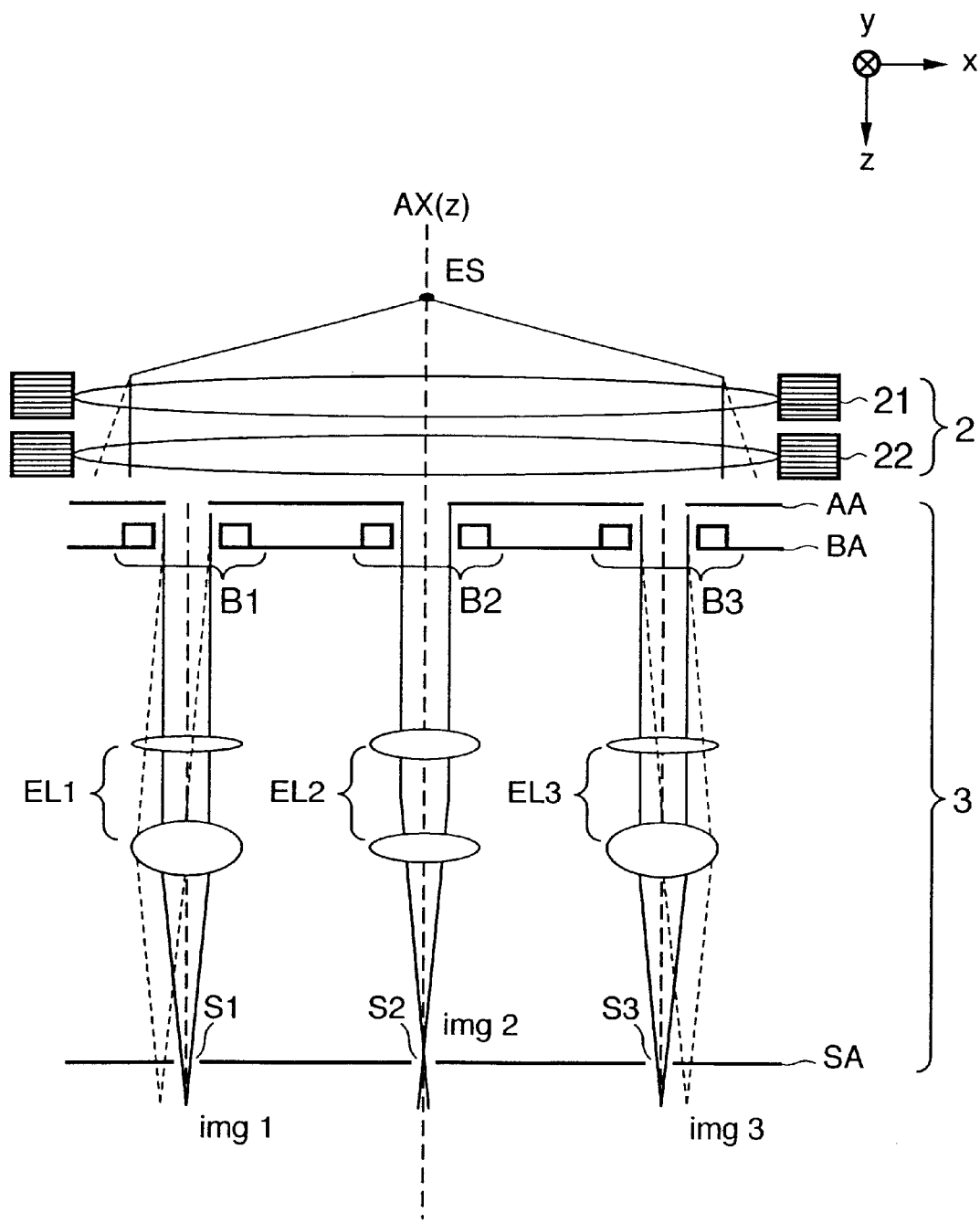
FIG. 6 is a sectional view for explaining the function of the correction electron optical system.

The function of the correction electron optical system 3 will be explained with reference to FIG. 6. In FIG. 6, electrons from the electron source ES for emitting electrons are changed into a substantially collimated beam by the condenser lens 2. The substantially collimated electron beam is incident on the aperture array AA where it is split into a plurality of electron beams. The split electron beams are incident on element electron optical systems EL1 to EL3, and form intermediate images img1 to img3 of the electron source ES at almost the front focal positions of the respective element electron optical systems.

Figure 7A:
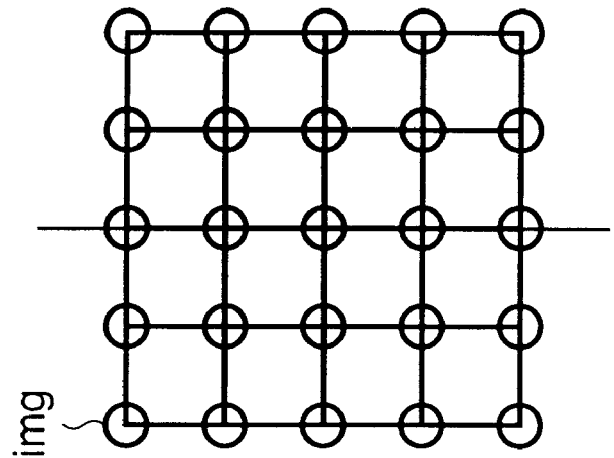
FIGS. 7A to 7C are views for explaining distortion of a reduction electron optical system.
Figure 7B:
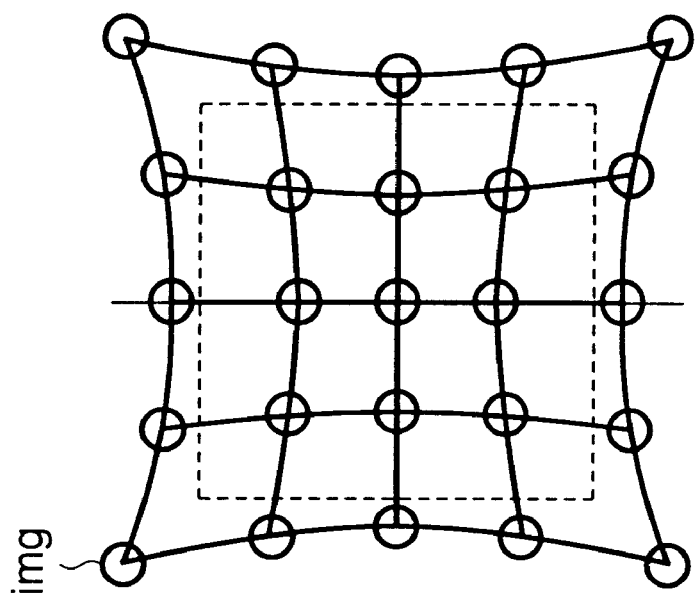
Figure 7C:
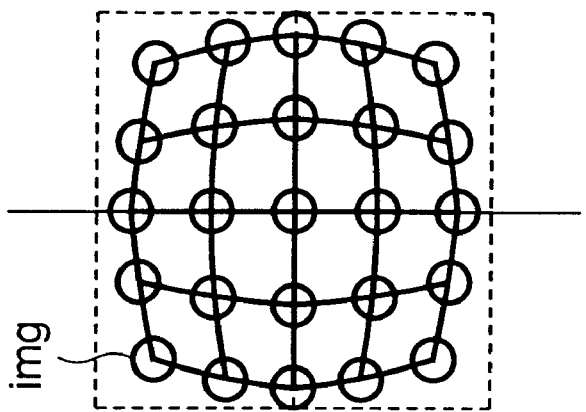

The intermediate images are projected on the wafer 5 serving as a surface to be exposed via the reduction electron optical system 4 shown in FIG. 1. To correct aberration which appears when a plurality of intermediate images are projected on the surface to be exposed, the optical characteristics of the element electron optical systems are individually adjusted. For example, the curvature of field (deviation between an actual imaging position and an ideal imaging position along the optical axis of the reduction electron optical system 4) can be corrected by adjusting an intermediate image formation position along the optical axis for each element electron optical system. Further, distortion as shown in FIGS. 7B and 7C can be corrected to a state as shown in FIG. 7A by adjusting an intermediate image formation position in a direction perpendicular to the optical axis for each element electron optical system.

Irradiation of electron beams on the wafer 5 is individually controlled by blankers B1 to B3 and stoppers S1 to S3. In FIG. 6, img3 is shielded by the stopper S3 by turning on the blanker B3.

Figure 8:
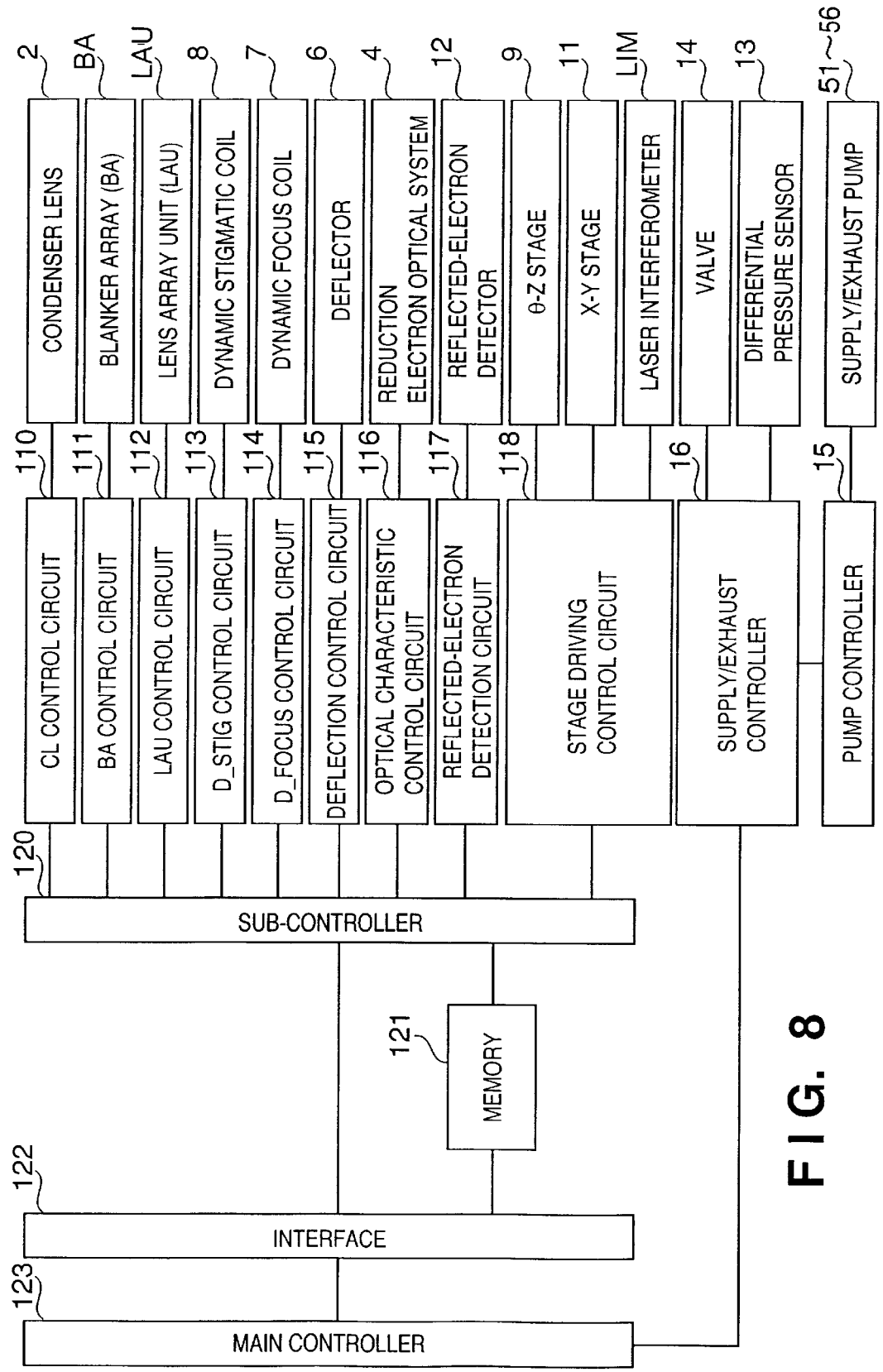
FIG. 8 is a block diagram showing the arrangement of the control system of the electron beam exposure apparatus shown in FIG. 1.

FIG. 8 is a block diagram showing the arrangement of the control-system of the electron beam exposure apparatus shown in FIG. 1. A BA control circuit 111 individually controls ON/OFF operations of the blankers of the blanker array BA. An LAU control circuit 112 controls the focal lengths of the electron lenses constituting the lens array unit LAU. A D_STIG control circuit 113 controls the dynamic stigmatic coil 8 to control astigmatism of the reduction electron optical system 4. A D_FOCUS control circuit 114 controls the dynamic focus coil 7 to control the focus of the reduction electron optical system 4. A deflection control circuit 115 controls the deflector 6. An optical characteristic control circuit 116 adjusts the optical characteristics (magnification and distortion) of the reduction electron optical system 4. A reflected-electron detection circuit 117 calculates a reflected electron amount on the basis of an output signal from the reflected-electron detector 12. A stage driving control circuit 118 drives and controls the θ-Z stage 9, and drives and controls the X-Y stage 11 in cooperation with a laser interferometer LIM for detecting the position of the X-Y stage 11.

The supply/exhaust controller 16 controls the valves 14 attached to the correction electron optical system 3 on the basis of output signals from the pressure sensors 13 attached to all or some of the substrates constituting the correction electron optical system 3, and at the same time controls the supply/exhaust pumps 51 to 56 via the pump controller 15. At this time, the valve 14 and supply/exhaust pumps 51 to 56 are controlled by the supply/exhaust controller 16 so as to prevent the pressure difference between the two sides of each substrate constituting the correction electron optical system 3 from exceeding a predetermined range (allowable range). Supply/exhaust control by the supply/exhaust controller 16 is automatically executed in accordance with instructions from the main controller 123 when, for example, the electron beam exposure apparatus is turned on or off or maintained, or an emergency occurs, i.e., high vacuum in the main body cover is canceled.

A sub-controller 120 distributes drawing control data stored in a memory 121 to a plurality of control circuits, and controls these control circuits. The sub-controller 120 is controlled by the main controller 123 for controlling the overall electron beam exposure apparatus via an interface 122.

Note that this embodiment employs the pressure sensors 13 to detect the pressure difference between the upper and lower surfaces of each electrode plate, and uses the controller to perform control based on the detection results. In other words, slight deformation information of the electrode plate upon a change in pressure difference is obtained by detecting the pressure difference. This deformation information can also be detected by, e.g., an optical method other than the pressure sensor. For example, a positional change on the surface of the electrode plate can be detected by using a photosensor for diagonally emitting a light beam to the surface of the electrode plate and detecting the reflected light, or a photosensor adopting the light interference principle. Thus, the pressure sensor 13 may be replaced with an equivalent photosensor which functions as the input of the controller. Alternatively, both the pressure sensor 13 and photosensor can be used to further increase the precision.

Figure 9:
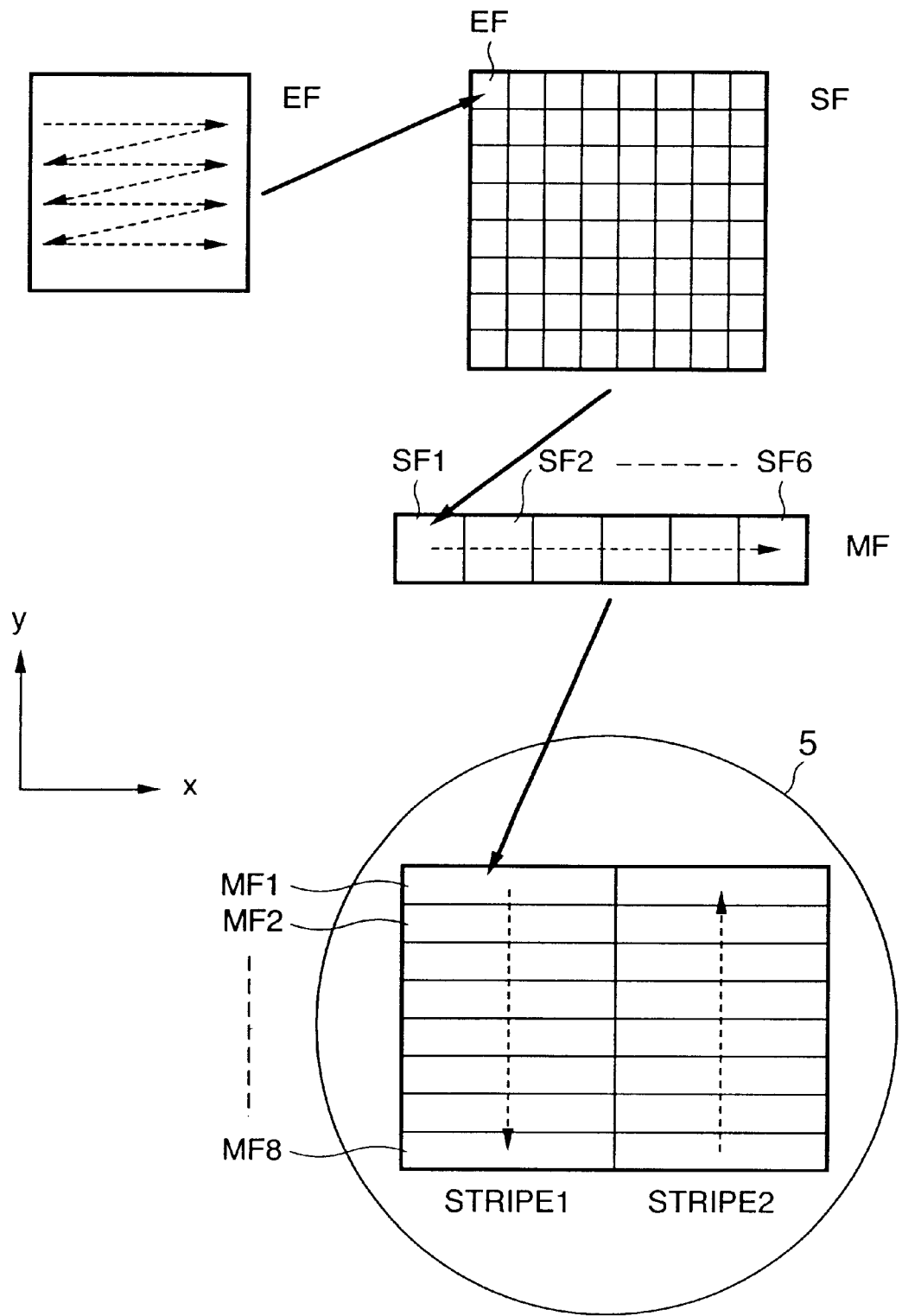
FIG. 9 is a view for explaining exposure procedures.

Exposure operation of the electron beam exposure apparatus according to the embodiment will be described with reference to FIG. 8. The sub-controller 120 instructs the deflection control circuit 115 to deflect a plurality of electron beams by the deflector 6 on the basis of exposure control data provided by the memory 121, and instructs the BA control circuit 111 to individually turn on/off the blankers of the blanker array BA in accordance with a pattern to be drawn on the wafer 5. At this time, the X-Y stage 11 continuously moves in the Y direction. The deflector 6 deflects a plurality of electron beams so as to follow movement of the X-Y stage. The respective electron beams scan and expose corresponding element exposure fields (EF) on the wafer 5, as shown in FIG. 9. The element exposure fields (EF) corresponding to the respective electron beams are two-dimensionally adjacent to each other. The pattern is simultaneously drawn without any blank on a subfield (SF) made up of a plurality of element exposure fields (EF).

After one subfield (SF1) is exposed, the sub-controller 120 instructs the deflection control circuit 115 to deflect a plurality of electron beams by the deflector 6 in a direction (X direction) perpendicular to the stage scan direction (Y direction) in order to expose the next subfield (SF2). At this time, aberration upon reducing and projecting each electron beam via the reduction electron optical system 4 also changes with switching of the subfield by deflection. Therefore, the sub-controller 120 instructs the LAU control circuit 112, D_STIG control circuit 113, and D_FOCUS control circuit 114 to adjust the lens array unit LAU, dynamic stigmatic coil 8, and dynamic focus coil 7 so as to correct the changed aberration. After that, a pattern is drawn again on subfield 2 (SF2) with a plurality of electron beams in the above manner.

As shown in FIG. 9, patterns are sequentially drawn on a plurality of subfields (SF1 to SF6) to draw a pattern on one main field (MF) formed from the subfields (SF1 to SF6) aligned in the direction (X direction) perpendicular to the stage scan direction (Y direction).

After exposure of main field 1 (MF1) shown in FIG. 9, the sub-controller 120 instructs the deflection control circuit 115 to sequentially deflect a plurality of electron beams to main fields (MF2, MF3, MF4, . . . ) aligned in the stage scan direction (Y direction) and draw patterns. Accordingly, a pattern is drawn on a stripe (STRIPE1) formed from the main fields (MF2, MF3, MF4, . . . ) The X-Y stage 11 is moved by one step in the X direction, and a pattern is drawn on the next stripe (STRIPE2).

Figure 12:
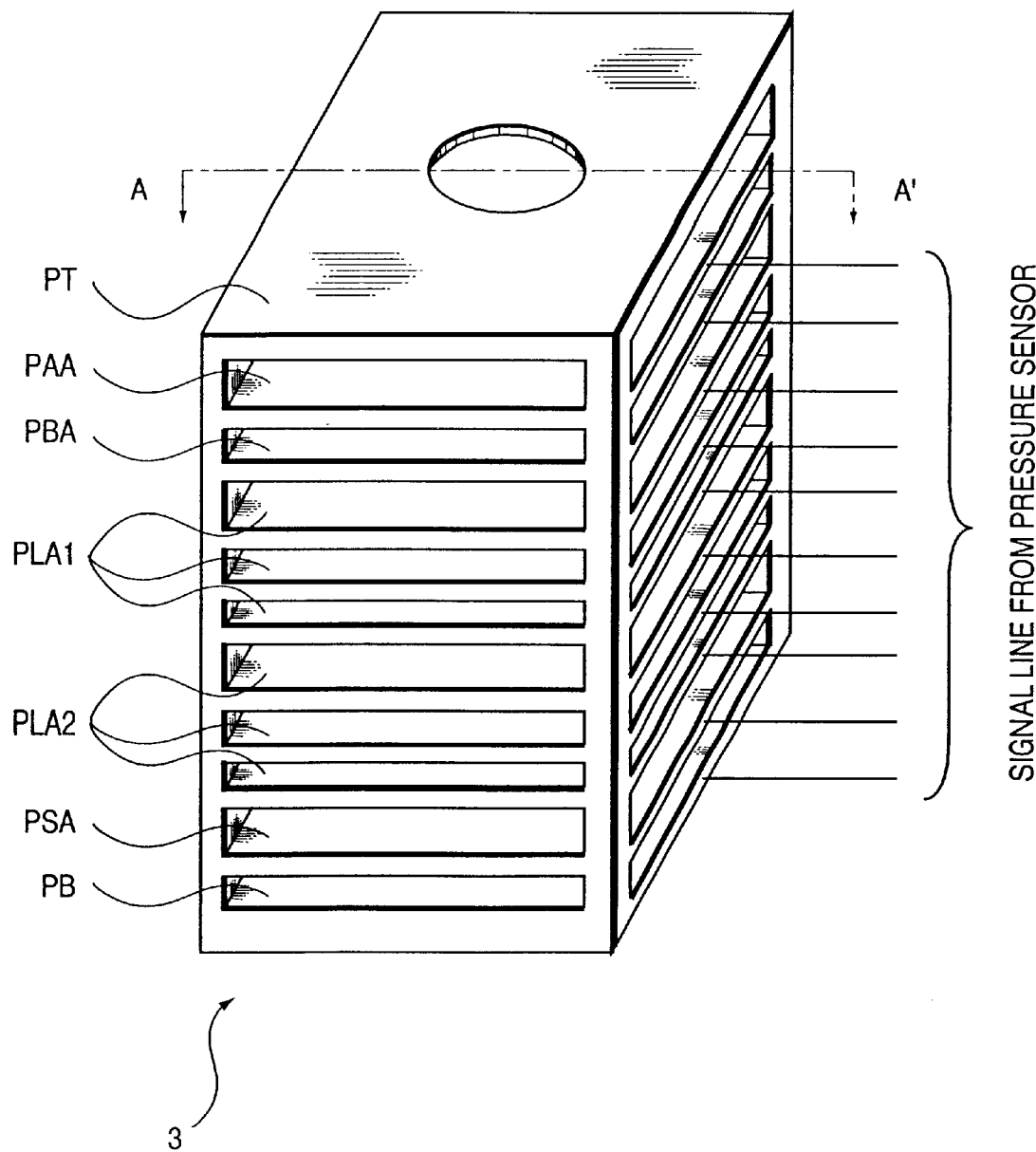
FIG. 12 is a perspective view showing the structure of a correction electron optical system 3 according to the first and second embodiments of the present invention.

Two preferred embodiments of the correction electron optical system 3 will be explained. FIG. 12 is a perspective view showing the structure of the correction electron optical system 3 according to the first and second embodiments of the present invention.

Figure 13:
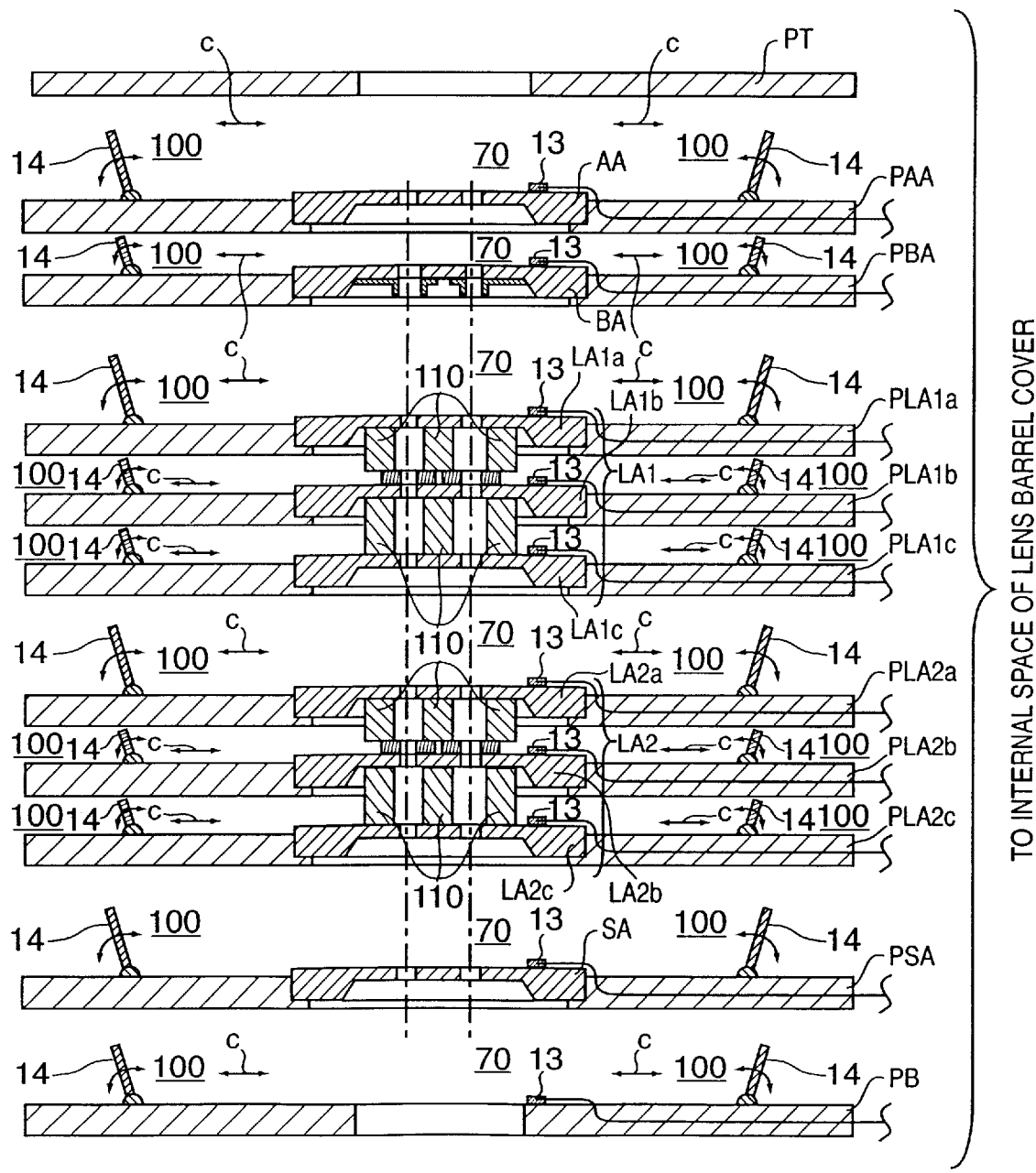
FIG. 13 is a sectional view of the correction electron optical system 3 according to the first embodiment of the present invention taken along the line A–A' in FIG. 12.

FIG. 13 is a sectional view of the correction electron optical system 3 according to the first embodiment of the present invention taken along the line A–A' in FIG. 12. For descriptive convenience, FIG. 13 shows 2×2 electron lenses. This correction electron optical system 3 is constituted by arranging along the optical axis an aperture array AA, a blanker array BA, three arrays LA1a (UE in FIG. 5), LA1b (CE in FIG. 5), and LA1c (LE in FIG. 5) constituting a first electron optical system LA1, three arrays LA2a (UE in FIG. 5), LA2b (CE in FIG. 5), and LA2c (LE in FIG. 5) constituting a second electron optical system LA2, and a stopper array SA. Spaces 70 are formed between the upper and lower surfaces of the arrays (substrates) AA, BA, LA1a, LA1b, LA1c, LA2a, LA2b, LA2c, and SA, and facing arrays or plates. Each array typically comprises a membrane having apertures on electron beam paths, and an annular support which supports the membrane.

The aperture array AA is supported by a partition plate PAA; the blanker array BA, by a partition plate PBA; the three substrates LA1a, LA1b, and LA1c constituting the first electron optical system array LA1, by partition plates PLA1a, PLA1b, and PLA1c; the three substrates LA2a, LA2b, and LA2c constituting the second electron optical system array LA2, by partition plates PLA2a, PLA2b, and PLA2c; and the stopper array SA, by a partition plate PSA. A partition plate PT is arranged at a position where the partition plate PT faces the partition plate PAA supporting the uppermost array AA; and a partition plate PB, at a position where the partition plate PB faces the partition plate PSA supporting the lowermost array SA. The facing partition plates form passages 100 which allow the spaces 70 between the upper and lower surfaces of the arrays (substrates) AA, BA, LA1a, LA1b, LA1c, LA2a, LA2b, LA2c, and SA to communicate with the internal space of the lens barrel cover 60 (further, that of the main body cover 80). Gas (e.g., air) is supplied/exhausted via the passages 100 in directions indicated by arrows C.

Figure 14:
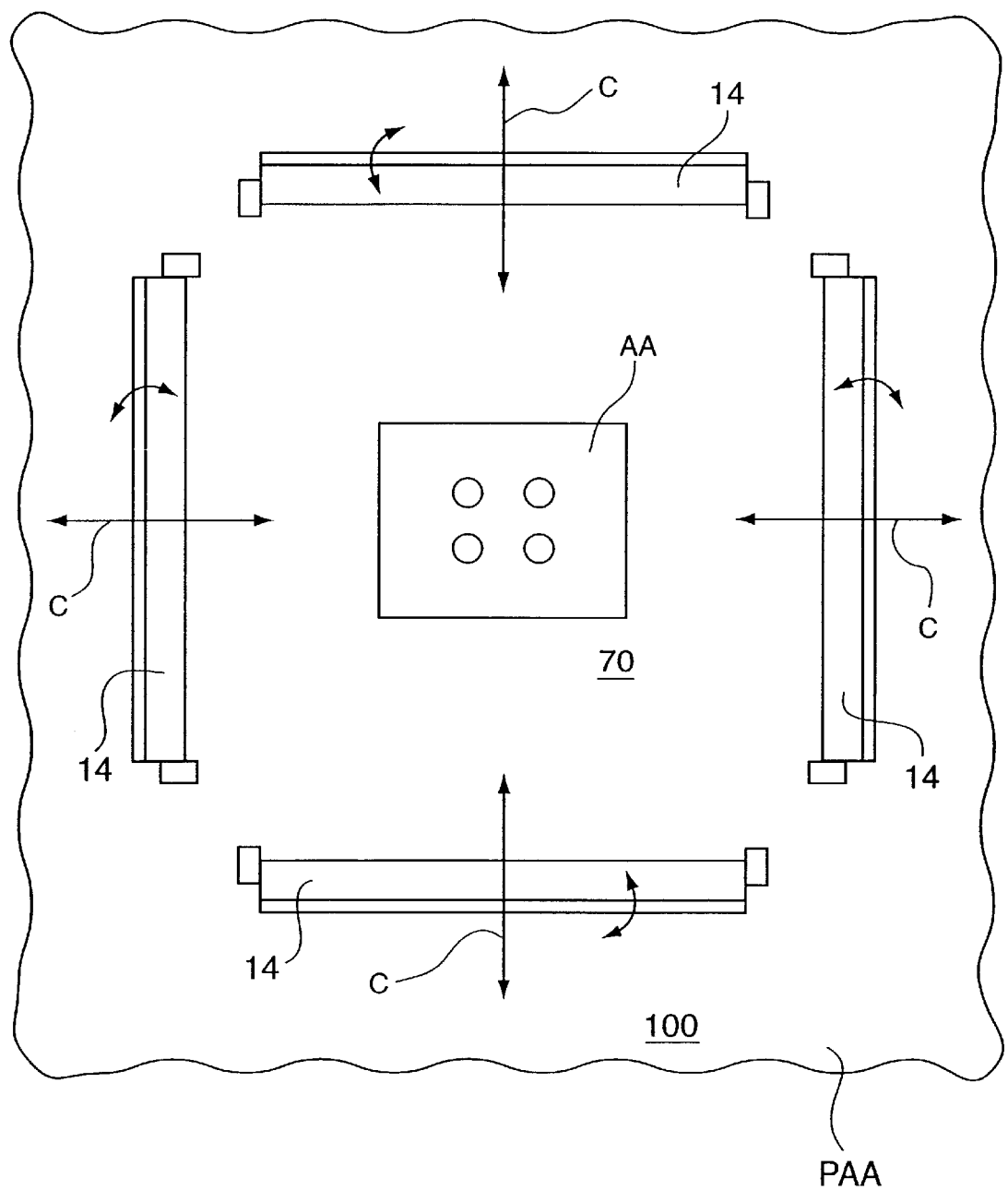
FIG. 14 is a plan view of an aperture array AA for explaining a layout of valves 14.

Valves 14 for adjusting the supply/exhaust conductance are disposed on the respective passages 100. These valves 14 are coupled to, e.g., rods (not shown) extending to the outside of the main body cover 80, and the opening degrees are controlled by movement of the rods. FIG. 14 is a plan view of the aperture array AA for explaining a layout of the valves 14.

The opening degrees of the valves 14 can be controlled by the above-described supply/exhaust controller 16 on the basis of outputs from the pressure sensors 13 so as to make the pressure difference between the upper and lower surfaces of each array fall within a predetermined range (allowable range). The supply/exhaust controller 16 also controls the supply/exhaust pumps 51 to 56 on the basis of outputs from the pressure sensors 13 so as to make the pressure difference between the upper and lower surfaces of each array constituting the correction electron optical system 3 fall within a predetermined range (allowable range).

Spacers 110 for coupling facing arrays and defining their intervals are interposed between the three arrays LA1$a$, LA1$b$, and LA1$c$ constituting the first electron-optical system LA1 and between the three arrays LA2$a$, LA2$b$, and LA2$c$ constituting the second electron optical system LA2. The spacers 110 interposed between facing arrays can increase the strengths of the first and second electron optical systems LA1 and LA2 to effectively prevent deformation or damage of the membranes of the arrays in supply/exhaust. The spacers 110 are disposed at positions where they do not close apertures formed in the arrays. The spacers 110 may be plate-like members having apertures at positions corresponding to apertures formed in the arrays, annular members which are separated from each other and have apertures at positions corresponding to apertures formed in the arrays, block-shaped members, linear members, or members having another structure.

Figure 15:
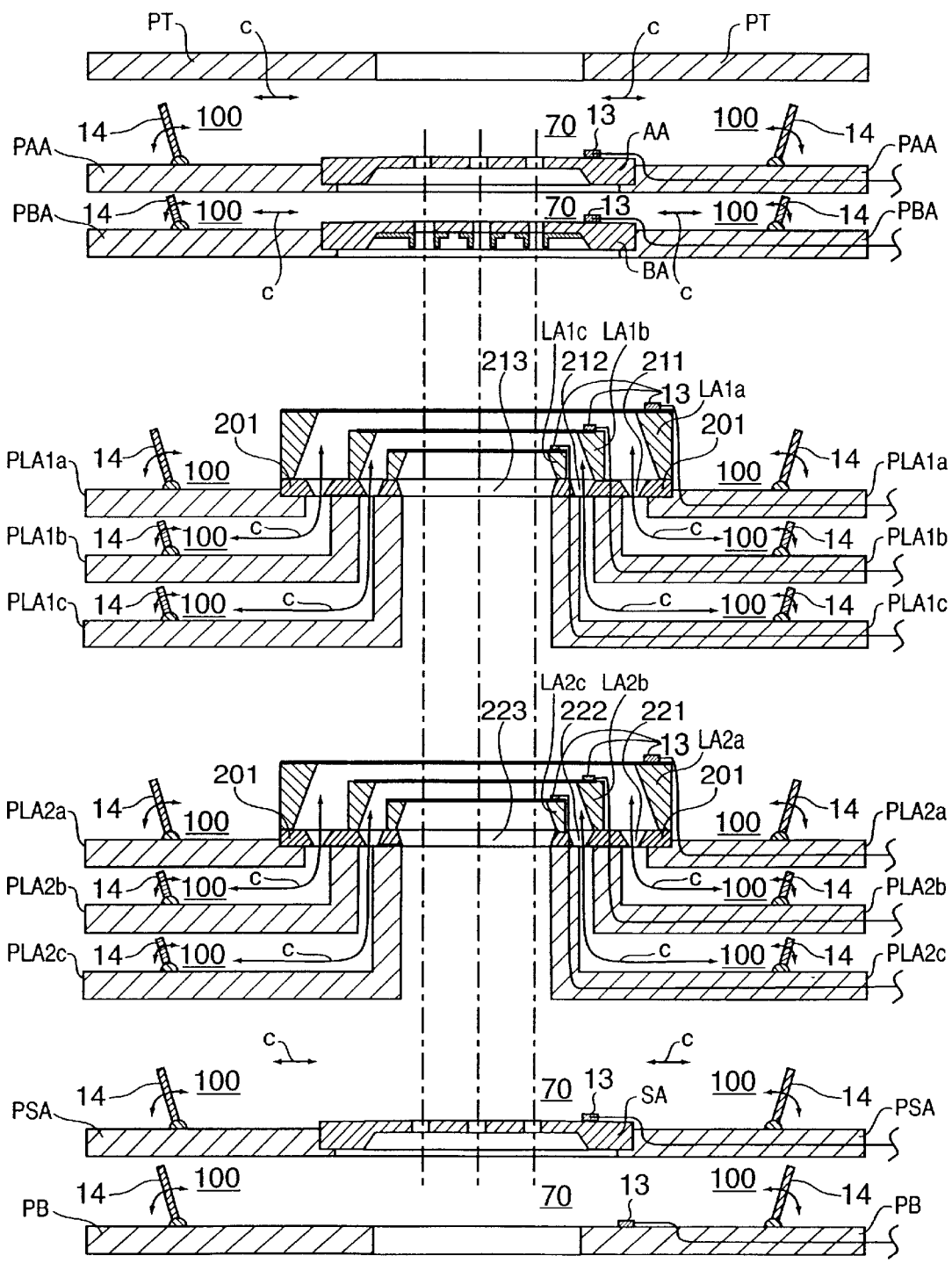
FIG. 15 is a sectional view of the correction electron optical system 3 according to the second embodiment of the present invention taken along the line A–A' in FIG. 12.

FIG. 15 is a sectional view of the correction electron optical system 3 according to the second embodiment of the present invention taken along the line A–A' in FIG. 12. For descriptive convenience, FIG. 15 shows 2×2 electron lenses. This correction electron optical system 3 is constituted by arranging along the optical axis an aperture array AA, a blanker array BA, three arrays LA1$a$ (UE in FIG. 5), LA1$b$ (CE in FIG. 5), and LA1$c$ (LE in FIG. 5) constituting a first electron optical system LA1, three arrays LA2$a$ (UE in FIG. 5), LA2$b$ (CE in FIG. 5), and LA2$c$ (LE in FIG. 5) constituting a second electron optical system LA2, and a stopper array SA. Spaces 70 are formed between the upper and lower surfaces of the arrays (substrates) AA, BA, LA1$a$, LA1$b$, LA1$c$, LA2$a$, LA2$b$, LA2$c$, and SA, and facing arrays or plates. Each array typically comprises a membrane having apertures on electron beam paths, and an annular support which supports the membrane.

The aperture array AA is supported by a partition plate PAA; the blanker array BA, by a partition plate PBA; the three substrates LA1$a$, LA1$b$, and LA1$c$ constituting the first electron optical system array LA1, by partition plates PLA1$a$, PLA1$b$, and PLA1$c$; the three substrates LA2$a$, LA2$b$, and LA2$c$ constituting the second electron optical system array LA2, by partition plates PLA2$a$, PLA2$b$, and PLA2$c$; and the stopper array SA, by a partition plate PSA. A partition plate PT is arranged at a position where the partition plate PT faces the partition plate PAA supporting the uppermost array AA; and a partition plate PB, at a position where the partition plate PB faces the partition plate PSA supporting the lowermost array SA. The spaces 70 between the upper and lower surfaces of the arrays (substrates) AA, BA, LA1$a$, LA1$b$, LA1$c$, LA2$a$, LA2$b$, LA2$c$, and SA communicate with the internal space of the lens barrel cover 60 (further, that of the main body cover 80) via passages 100. Gas (e.g., air) is supplied/exhausted via the passages 100 in directions indicated by arrows C.

Valves 14 for adjusting the supply/exhaust conductance are disposed on the respective passages 100. These valves 14 are coupled to, e.g., rods (not shown) extending to the outside of the main body cover 80, and the opening degrees are controlled by movement of the rods.

The opening degrees of the valves 14 can be controlled by the above-described supply/exhaust controller 16 on the basis of outputs from the pressure sensors 13 so as to make the pressure difference between the upper and lower surfaces of each array fall within a predetermined range (allowable range). The supply/exhaust controller 16 also controls the supply/exhaust pumps 51 to 56 on the basis of outputs from the pressure sensors 13 so as to make the pressure difference between the upper and lower surfaces of each array constituting the correction electron optical system 3 fall within a predetermined range (allowable range).

The three arrays LA1$a$, LA1$b$, and LA1$c$ constituting the first electron optical system LA1 are supported by a base substrate 201, and form a nested structure. The three arrays LA2$a$, LA2$b$, and LA2$c$ constituting the second electron optical system LA2 are supported by a base substrate 202, and form a nested structure. These nested structures provide the following advantages.

(1) The interval between the membranes of facing arrays can be easily decreased. This effect is prominent particularly in a multilayered structure of three or more electrodes.

(2) Since the substrate portion (support portion) of each electrode can be made thick, a high strength can be ensured to increase reliability, processability, and ease of assembly.

(3) Since each electrode is aligned using one base substrate as a position reference, the alignment accuracy of substrates increases.

Figure 16:
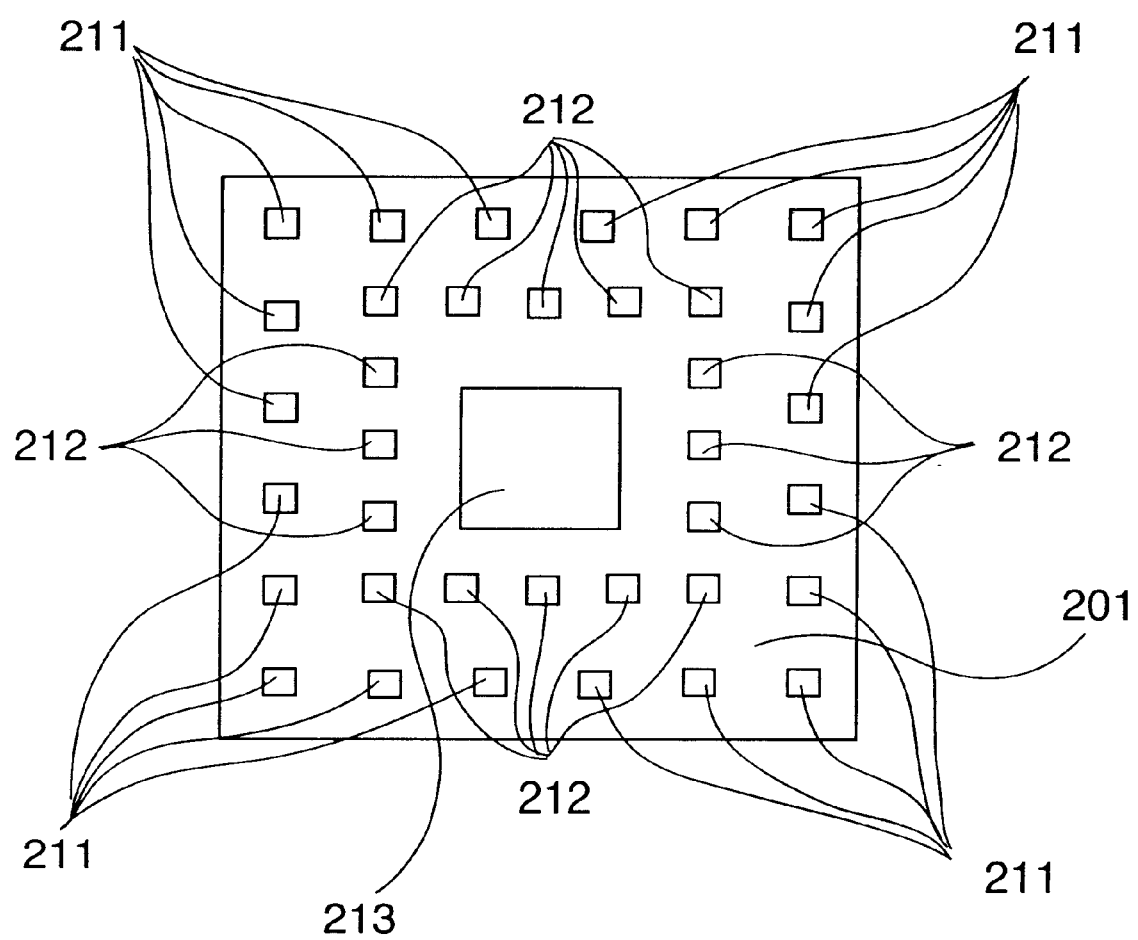
FIG. 16 is a view of a base substrate 201 when viewed from the lower surface.

The base substrate 201 has an aperture 211 which allows the space 70 between the arrays LA1$a$ and LA1$b$ to communicate with the passage 100, an aperture 212 which allows the space 70 between the arrays LA1$b$ and LA1$c$ to communicate with the passage 100, and an aperture 213 which allows the space below the lower surface of the array LA1$c$ to communicate with the passage 100 via the space below the base substrate 201. FIG. 16 is a view of the base substrate 201 when viewed from the lower surface.

The base substrate 202 similarly has an aperture 221 which allows the space 70 between the arrays LA2$a$ and LA2$b$ to communicate with the passage 100, an aperture 222 which allows the space 70 between the arrays LA2$b$ and LA2$c$ to communicate with the passage 100, and an aperture 223 which allows the space below the lower surface of the array LA2$c$ to communicate with the passage 100 via the space below the base substrate 202.

The apertures which are formed in the base substrates 201 and 202 and allow the space facing the array to communicate with the passages 100 can effectively prevent deformation or damage of the membranes of the arrays in supply/exhaust.

A production system for a semiconductor device (semiconductor chip such as an IC or LSI, liquid crystal panel, CCD, thin-film magnetic head, micromachine, or the like) using the exposure apparatus will be exemplified. A trouble remedy or periodic maintenance of a manufacturing apparatus installed in a semiconductor manufacturing factory, or maintenance service such as software distribution is performed by using a computer network outside the manufacturing factory.

Figure 17:
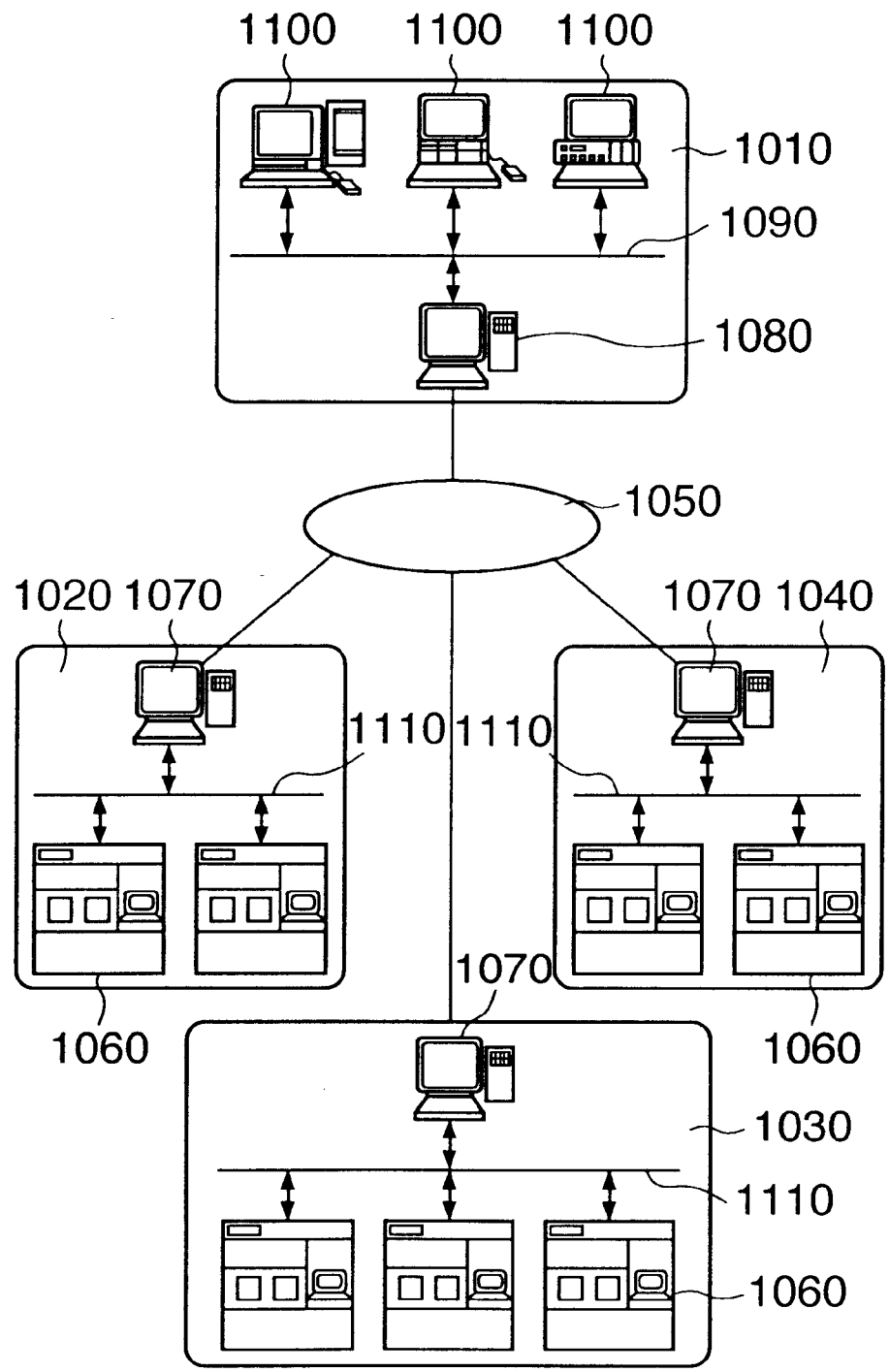
FIG. 17 is a view showing an overall system cut out at a given angle.

FIG. 17 shows the overall system cut out at a given angle. In FIG. 17, reference numeral 1010 denotes a business office of a vendor (apparatus supply manufacturer) which provides a semiconductor device manufacturing apparatus. Assumed examples of the manufacturing apparatus are semiconductor manufacturing apparatuses for various processes used in a semiconductor manufacturing factory, such as pre-process apparatuses (lithography apparatus including an exposure apparatus, resist processing apparatus, and etching apparatus, annealing apparatus, film formation apparatus, planarization apparatus, and the like) and post-process apparatuses (assembly apparatus, inspection apparatus, and the like). The business office 1010 comprises a host management system 1080 for providing a maintenance database for the manufacturing apparatus, a plurality of operation terminal computers 1100, and a LAN (Local Area Network) 1090 which connects the host management system 1080 and computers 1100 to build an intranet. The host management system 1080 has a gateway for connecting the LAN 1090 to Internet 1050 as an external network of the business office, and a security function for limiting external accesses.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to build an intranet, and a host management system 1070 serving as a monitoring apparatus for monitoring the operation status of each manufacturing apparatus 1060. The host management system 1070 in each of the factories 1020 to 1040 has a gateway for connecting the LAN 1110 in the factory to the Internet 1050 as an external network of the factory. Each factory can access the host management system 1080 of the vendor 1010 from the LAN 1110 via the Internet 1050. Typically, the security function of the host management system 1080 authorizes access of only a limited user to the host management system 1080.

In this system, the factory notifies the vendor via the Internet 1050 of status information (e.g., the symptom of a manufacturing apparatus in trouble) representing the operation status of each manufacturing apparatus 1060. The vendor can transmit, to the factory, response information (e.g., information designating a remedy against the trouble, or remedy software or data) corresponding to the notification, or maintenance information such as the latest software or help information. Data communication between the factories 1020 to 1040 and the vendor 1010 and data communication via the LAN 1110 in each factory typically adopt a communication protocol (TCP/IP) generally used in the Internet. Instead of using the Internet as an external network of the factory, a dedicated network (e.g., ISDN) having high security which inhibits access of a third party can be adopted. Also the user may construct a database in addition to the one provided by the vendor and set the database on an external network, and the host management system may authorize access to the database from a plurality of user factories.

Figure 18:
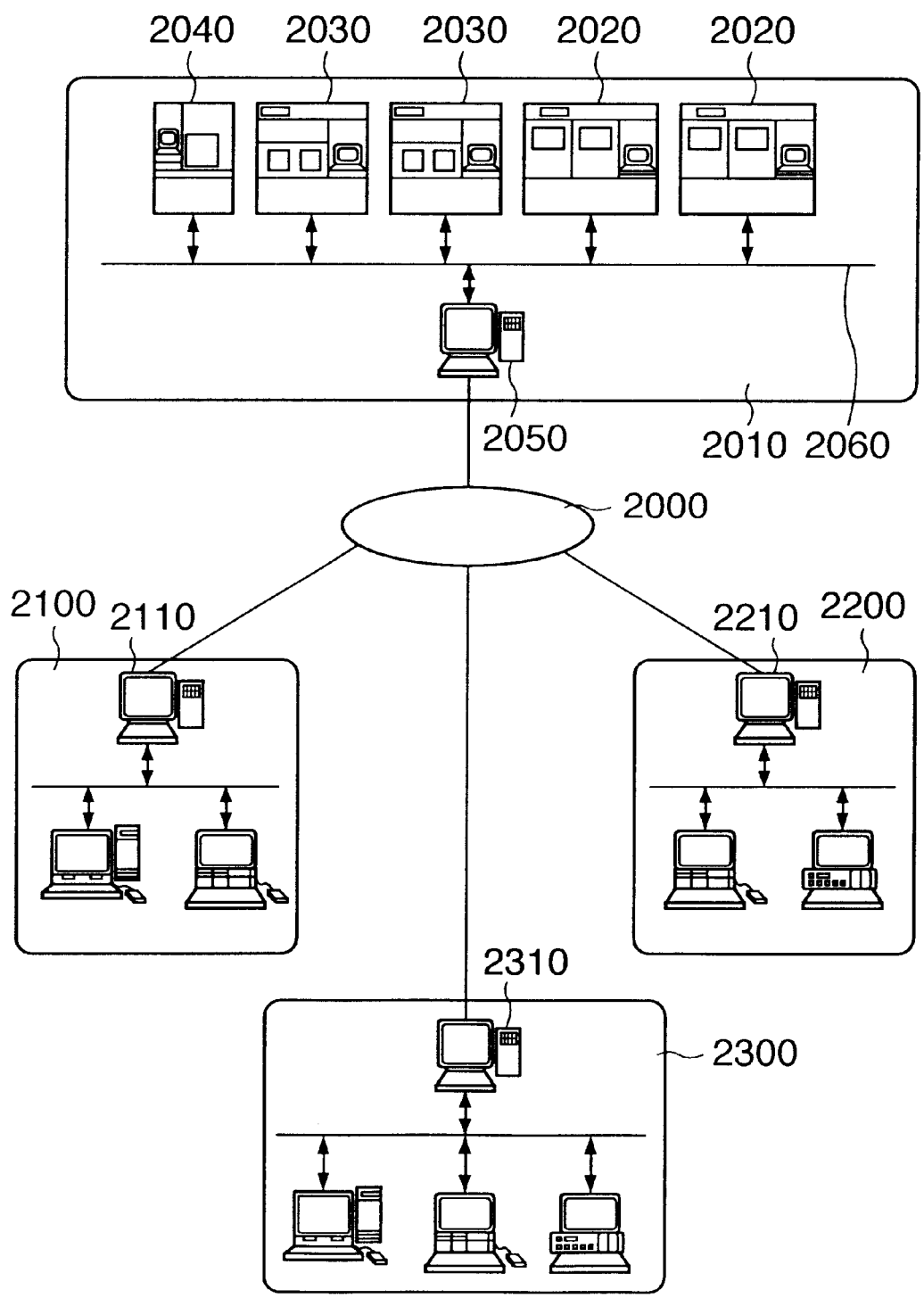
FIG. 18 is a view showing the concept of the overall system of this embodiment that is cut out at an angle different from FIG. 17.

FIG. 18 is a view showing the concept of the overall system of this embodiment that is cut out at a different angle from FIG. 17. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 18, a factory having manufacturing apparatuses of a plurality of vendors and the management systems of the vendors for these manufacturing apparatuses are connected via the external network of the factory, and maintenance information of each manufacturing apparatus is communicated. In FIG. 18, reference numeral 2010 denotes a manufacturing factory of a manufacturing apparatus user (semiconductor device manufacturer) where manufacturing apparatuses for various processes, e.g., an exposure apparatus 2020, resist processing apparatus 2030, and film formation apparatus 2040 are installed in the manufacturing line of the factory. FIG. 18 shows only one manufacturing factory 2010, but a plurality of factories are networked in practice. The respective apparatuses in the factory are connected to a LAN 2060 to build an intranet, and a host management system 2050 manages the operation of the manufacturing line. The business offices of vendors (apparatus supply manufacturers) such as an exposure apparatus manufacturer 2100, resist processing apparatus manufacturer 2200, and film formation apparatus manufacturer 2300 comprise host management systems 2110, 2210, and 2310 for executing remote maintenance for the supplied apparatuses. Each host management system has a maintenance database and a gateway for an external network, as described above. The host management system 2050 for managing the apparatuses in the manufacturing factory of the user, and the management systems 2110, 2210, and 2310 of the vendors for the respective apparatuses are connected via the Internet or dedicated network serving as an external network 2000. If a trouble occurs in any one of a series of manufacturing apparatuses along the manufacturing line in this system, the operation of the manufacturing line stops. This trouble can be quickly solved by remote maintenance from the vendor of the apparatus in trouble via the Internet 2000. This can minimize the stop of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 19 on the display. While referring to this window, the operator who manages manufacturing apparatuses in each factory inputs, in input items on the windows, pieces of information such as the type of manufacturing apparatus (4010), serial number (4020), subject of trouble (4030), occurrence date (4040), degree of urgency (4050), symptom (4060), remedy (4070), and progress (4080). The pieces of input information are transmitted to the maintenance database via the Internet, and appropriate maintenance information is sent back from the maintenance database and displayed on the display. The user interface provided by the web browser realizes hyperlink functions (4100 to 4120), as shown in FIG. 19. This allows the operator to access detailed information of each item, receive the latest-version software to be used for a manufacturing apparatus from a software library provided by a vendor, and receive an operation guide (help information) as a reference for the operator in the factory.

A semiconductor device (semiconductor element) manufacturing process using the electron beam exposure apparatus will be explained.

Figure 11:
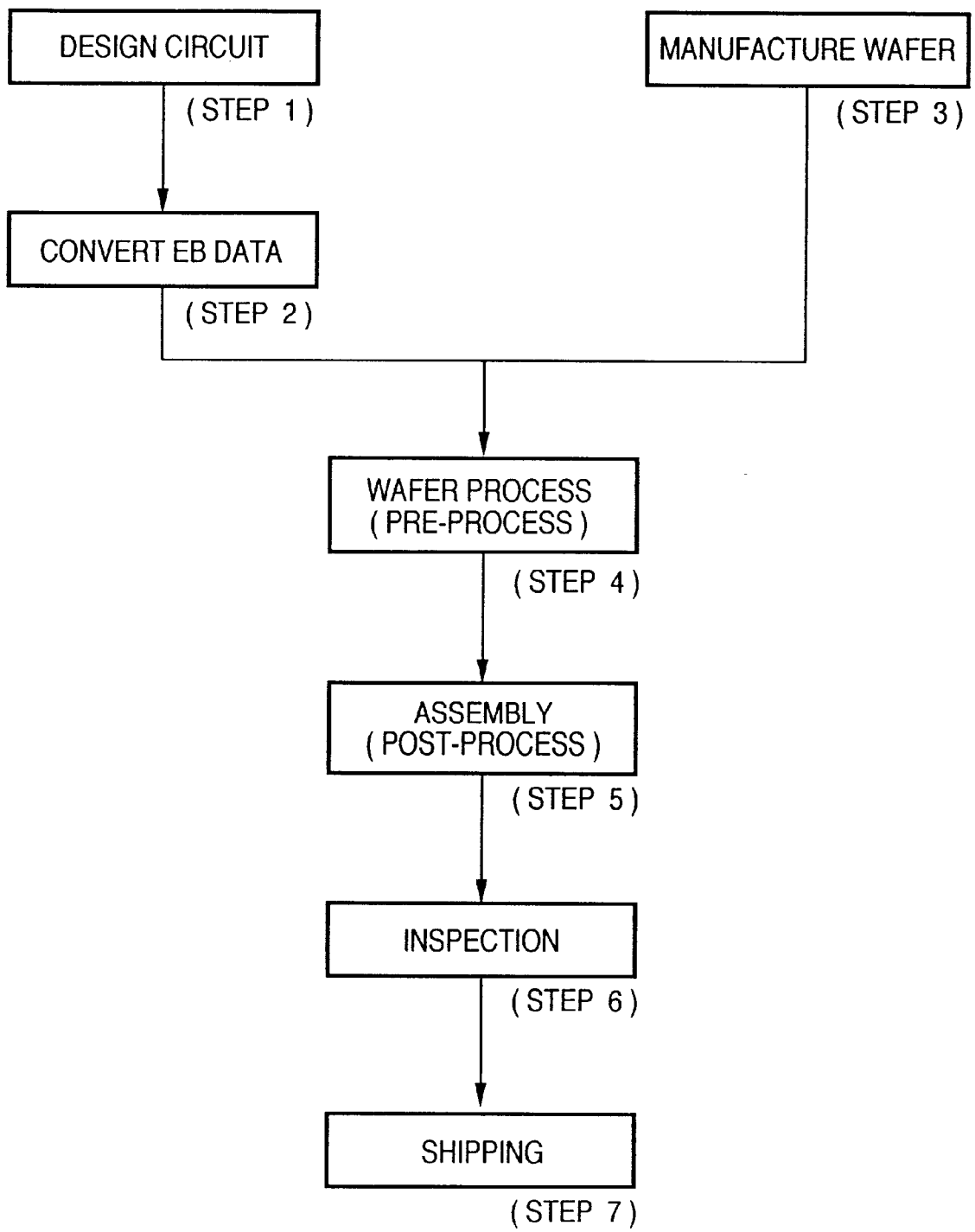
FIG. 11 is a flow chart showing the device manufacturing method.

FIG. 11 is a flow chart showing the manufacture of a semiconductor device (semiconductor chip such as an IC or LSI, liquid crystal panel, CCD, or the like). In step 1 (circuit design), a semiconductor device circuit is designed. In step 2 (EB data conversion), the designed circuit pattern is converted into data for the electron beam exposure apparatus. In step 3 (wafer manufacture), a wafer is manufactured by using a material such as silicon.

In step 4 (wafer process) called a pre-process, a circuit is formed on the wafer by lithography in accordance with the data for the electron beam exposure apparatus. More specifically, a wafer coated with a resist is loaded into the electron beam exposure apparatus. Global alignment data on the wafer is read by an alignment unit, the wafer stage is driven based on the result, and patterns are sequentially drawn at predetermined positions. The substrate on which the patterns are drawn is developed.

Step 5 (assembly) called a post-process is the step of forming a semiconductor chip by using the wafer manufactured in step 4, and includes an assembly process (dicing and bonding) and packaging process (chip encapsulation).

In step 6 (inspection), inspections such as the operation confirmation test and durability test of the semiconductor device manufactured in step 5 are conducted. After these steps, the semiconductor device is completed and shipped (step 7).

Figure 10:
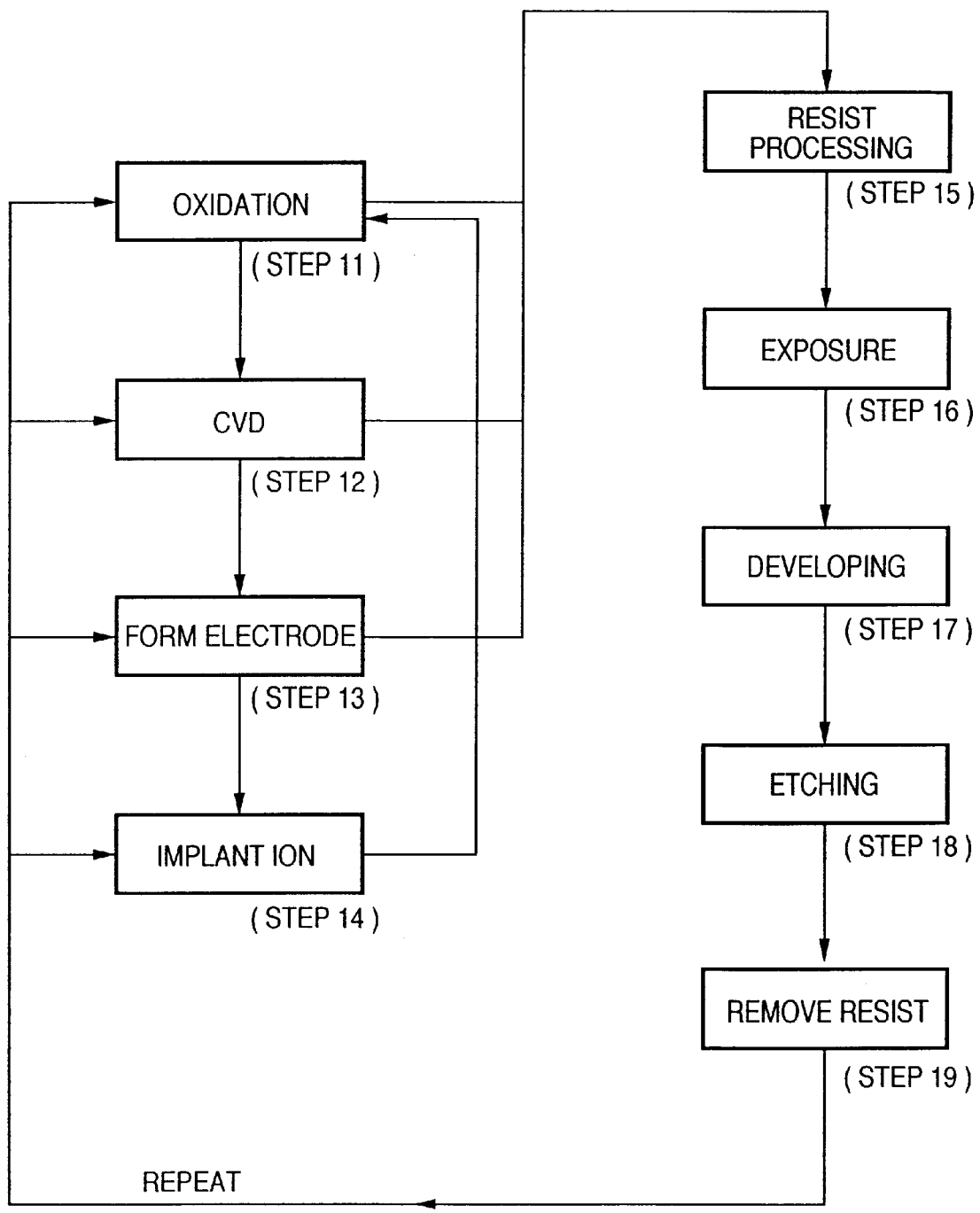
FIG. 10 is a flow chart showing a device manufacturing method.

FIG. 10 is a flow chart showing the wafer process of step 4 in FIG. 11 in detail. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer.

In step 15 (resist processing), a resist is applied to the wafer. In step 16 (drawing), the electron beam exposure apparatus draws a circuit pattern on the wafer. In step 17 (developing), the exposed wafer is developed. In step 18 (etching), an unwanted portion of the film formed in steps S11 to S13 is etched by using the developed resist, thereby patterning the film. These steps are repeated to form a multilayered patterns on the wafer.

The present invention can prevent deformation of or damage to the electrode plate of an electron optical system without degrading the performance or device manufacturing productivity of a charged-particle beam exposure apparatus.

As many apparently widely different embodiments of the present invention can be made without departing from the spirit and scope thereof, it is to be understood that the invention is not limited to the specific embodiments thereof except as defined in the claims.

What is claimed is:

1. A charged-particle beam exposure apparatus comprising:
    a charged-particle beam source;
    an electron optical system which irradiates a device material with a charged-particle beam emitted by said charged-particle beam source and includes a substrate having an aperture for transmitting the charged-particle beam;
    a cover which covers said charged-particle beam source and said electron optical system;
    an adjustment mechanism for adjusting a pressure in an internal space of said cover; and
    a relaxing mechanism for relaxing a pressure difference between upper and lower surfaces of the substrate upon a change in pressure in the internal space.

2. The apparatus according to claim 1, wherein said relaxing mechanism has a passage which allows a space facing the substrate to communicate with the internal space.

3. The apparatus according to claim 2, wherein said relaxing mechanism has a valve at an end of the passage or midway along the passage.

4. The apparatus according to claim 3, further comprising a controller for controlling an opening degree of the valve.

5. The apparatus according to claim 4, wherein
    the apparatus further comprises a sensor for measuring information about the substrate, and
    said controller controls at least one of an opening degree of the valve and said adjustment mechanism on the basis of an output from said sensor.

6. The apparatus according to claim 5, wherein said sensor has a pressure sensor for detecting the pressure difference between the upper and lower surfaces of the substrate.

7. The apparatus according to claim 5, wherein said sensor has a photosensor for optically detecting deformation of the substrate.

8. The apparatus according to claim 4, wherein said controller automatically executes control when the charged-particle beam exposure apparatus is turned on or off or maintained, or an emergency occurs.

9. The apparatus according to claim 1, wherein
    said electron optical system has a plurality of substrates in which apertures for transmitting the charged-particle beam emitted by said charged-particle beam source are formed, and
    said relaxing mechanism relaxes a pressure difference between upper and lower surfaces of each substrate.

10. The apparatus according to claim 1, wherein said relaxing mechanism relaxes the pressure difference so as to prevent the pressure difference between the upper and lower surfaces of the substrate from exceeding a predetermined range.

11. The apparatus according to claim 1, wherein the substrate has an electrode for applying a potential to the aperture of the substrate.

12. The apparatus according to claim 1, wherein said electron optical system includes:
    a plurality of substrates which have apertures for transmitting the charged-particle beam emitted by said charged-particle beam source and are arranged along a path of the charged-particle beam; and
    spacers disposed at all or some of intervals between the plurality of substrates.

13. The apparatus according to claim 12, wherein the spacers have apertures at positions corresponding to the apertures formed in the plurality of substrates.

14. The apparatus according to claim 1, wherein
    said electron optical system includes a plurality of substrates which have apertures for transmitting the charged-particle beam emitted by said charged-particle beam source and are arranged along a path of the charged-particle beam, and
    all or some of the plurality of substrates are arranged to form a nested structure.

15. The apparatus according to claim 14, wherein
    the plurality of substrates respectively have membranes in which apertures are formed, and annular supports which support the membranes,
    said electron optical system further includes a base substrate which commonly supports the supports of the substrates which form the nested structure, and
    the base substrate has an aperture which allows a space defined by the nested structure to communicate with the internal space of said cover.

16. A device manufacturing method comprising the steps of:
drawing a pattern on a device material by irradiating the device material with a charged-particle beam emitted by a charged-particle beam source via an electron optical system including a substrate having an aperture for transmitting the charged-particle beam; and
relaxing a change in pressure difference between upper and lower surfaces of the substrate.

17. The method according to claim 16, wherein the step of relaxing the change in-pressure difference includes at least one of the step of adjusting a pressure in an internal space of a cover which covers the charged-particle beam source and the electron optical system, and the step of controlling a valve interposed between a space facing the substrate and the internal space of the cover which covers the charged-particle beam source and the electron optical system.

18. The method according to claim 16, further comprising the steps of:
applying a photosensitive agent to the device material; and
developing the device material on which the pattern is drawn.

19. A device manufacturing method comprising the steps of:
installing a plurality of semiconductor manufacturing apparatuses including a charged-particle beam exposure apparatus in a factory; and
manufacturing a semiconductor device by using the plurality of semiconductor manufacturing apparatuses,
wherein the charged-particle beam exposure apparatus has
a charged-particle beam source,
an electron optical system which irradiates a device material with a charged-particle beam emitted by the charged-particle beam source and includes a substrate having an aperture for transmitting the charged-particle beam,
a cover which covers the charged-particle beam source and the electron optical system,
an adjustment mechanism for adjusting a pressure in an internal space of the cover, and
a relaxing mechanism for relaxing a pressure difference between upper and lower surfaces of the substrate upon a change in pressure in the internal space.

20. The method according to claim 19, further comprising the steps of:
connecting the plurality of semiconductor manufacturing apparatuses via a local area network;
connecting the local area network to an external network of the factory;
acquiring information about the charged-particle beam exposure apparatus from a database on the external network by using the local area network and the external network; and
controlling the charged-particle beam exposure apparatus on the basis of the acquired information.

21. A semiconductor manufacturing factory comprising:
a plurality of semiconductor manufacturing apparatuses including a charged-particle beam exposure apparatus;
a local area network for connecting said plurality of semiconductor manufacturing apparatuses; and
a gateway for connecting the local area network to an external network of the semiconductor manufacturing factory,
wherein said charged-particle beam exposure apparatus has
a charged-particle beam source,
an electron optical system which irradiates a device material with a charged-particle beam emitted by said charged-particle beam source and includes a substrate having an aperture for transmitting the charged-particle beam,
a cover which covers said charged-particle beam source and said electron optical system,
an adjustment mechanism for adjusting a pressure in an internal space of said cover, and
a relaxing mechanism for relaxing a pressure difference between upper and lower surfaces of the substrate upon a change in pressure in the internal space.

22. A maintenance method for a charged-particle beam exposure apparatus, comprising the steps of:
preparing a database for accumulating information about maintenance of the charged-particle beam exposure apparatus on an external network of a factory where the charged-particle beam exposure apparatus is installed;
connecting the charged-particle beam exposure apparatus to a local area network in the factory; and
maintaining the charged-particle beam exposure apparatus on the basis of the information accumulated in the database by using the external network and the local area network,
wherein the charged-particle beam exposure apparatus has
a charged-particle beam source,
an electron optical system which irradiates a device material with a charged-particle beam emitted by the charged-particle beam source and includes a substrate having an aperture for transmitting the charged-particle beam,
a cover which covers the charged-particle beam source and the electron optical system,
an adjustment mechanism for adjusting a pressure in an internal space of the cover, and
a relaxing mechanism for relaxing a pressure difference between upper and lower surfaces of the substrate upon a change in pressure in the internal space.

* * * * *

UNITED STATES PATENT AND TRADEMARK OFFICE
CERTIFICATE OF CORRECTION

PATENT NO. : 6,603,128 B2
DATED : August 5, 2003
INVENTOR(S) : Hiroshi Maehara et al.

It is certified that error appears in the above-identified patent and that said Letters Patent is hereby corrected as shown below:

Column 5,
Line 32, "irridates" should read -- irridate --.

Column 10,
Line 22, "MF4,…)" should read -- MF4,…). --.

Column 15,
Line 38, "patterns" should read -- pattern --.

Column 17,
Line 11, "in-pressure" should read -- in pressure --.

Signed and Sealed this

Twenty-third Day of November, 2004

JON W. DUDAS
*Director of the United States Patent and Trademark Office*